(12) United States Patent
Chun et al.

(10) Patent No.: US 12,401,553 B2
(45) Date of Patent: Aug. 26, 2025

(54) SEMICONDUCTOR DEVICE

(71) Applicant: Samsung Electronics Co., Ltd., Suwon-si (KR)

(72) Inventors: Junghoon Chun, Seoul (KR); Jaenam Kim, Incheon (KR); Sanghyeon Park, Yongin-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 135 days.

(21) Appl. No.: 18/360,063

(22) Filed: Jul. 27, 2023

(65) Prior Publication Data

US 2024/0103564 A1 Mar. 28, 2024

(30) Foreign Application Priority Data

Oct. 7, 2022 (KR) .................. 10-2022-0128762

(51) Int. Cl.
*H04L 25/49* (2006.01)
*G06F 5/06* (2006.01)
*G06F 13/38* (2006.01)
*G11C 7/10* (2006.01)
*G11C 11/4096* (2006.01)

(52) U.S. Cl.
CPC ............ *H04L 25/4917* (2013.01); *G06F 5/06* (2013.01); *G06F 13/38* (2013.01); *G11C 7/1006* (2013.01); *G11C 11/4096* (2013.01)

(58) Field of Classification Search
CPC ... H04L 25/4917; H04L 25/0272; G06F 5/06; G06F 13/38; G06F 13/4282; G06F 13/4291; H04B 14/023; G11C 7/10; G11C 7/1006; G11C 7/1051; G11C 7/1057; G11C 11/4096
See application file for complete search history.

(56) References Cited

U.S. PATENT DOCUMENTS

| | | |
|---|---|---|
| 6,490,069 B1 | 12/2002 | Kahn et al. |
| 7,257,329 B2 | 8/2007 | Azadet et al. |
| 7,961,778 B2 | 6/2011 | Buckwalter et al. |
| 8,654,898 B2 | 2/2014 | Bereza et al. |

(Continued)

FOREIGN PATENT DOCUMENTS

| | | |
|---|---|---|
| JP | 6470198 B2 | 2/2019 |
| JP | 6491613 B2 | 3/2019 |

OTHER PUBLICATIONS

Marc-Andre LaCroix et al., "A 116Gb/s DSP-Based Wireline Transceiver in 7nm CMOS Achieving 6pJ/b at 45dB Loss in PAM-4/Duo-PAM-4 and 52dB in PAM-2", ISSCC 2021.

(Continued)

*Primary Examiner* — Betsy Deppe
(74) *Attorney, Agent, or Firm* — Harness, Dickey & Pierce P.L.C.

(57) ABSTRACT

An example embodiment of the present invention provides a semiconductor device including: an encoder configured to receive a plurality of bit data by dividing the plurality of bit data into first group data and second group data, the plurality of bit data being divided into 2-bit units, to delay the second group data for a first period, and to output the first group data and the delayed second group data; and an output driver configured to output the first group data and the delayed second group data together to an external semiconductor device.

20 Claims, 21 Drawing Sheets

(56) References Cited

U.S. PATENT DOCUMENTS

| | | | |
|---|---|---|---|
| 9,269,412 B2* | 2/2016 | Shim | G11C 11/4076 |
| 10,171,281 B2 | 1/2019 | Dickson et al. | |
| 10,523,328 B2 | 12/2019 | Gopalakrishnan | |
| 11,258,650 B2 | 2/2022 | Zuo et al. | |
| 11,307,771 B2* | 4/2022 | Tatapudi | G11C 7/10 |
| 2020/0242062 A1* | 7/2020 | Lee | G06F 13/4282 |
| 2021/0266140 A1 | 8/2021 | Stojanovic | |

OTHER PUBLICATIONS

Jhih-Heng Yan et al., "DSP Equalization-free Data Center Communication with High Dispersion Tolerant Optical Duobinary-PAM4 Signal", CLEO 2017.

Jri Lee et al., "Design and Comparison of Three 20-Gb/s Backplane Transceivers for Duobinary, PAM4, and NRZ Data", IEEE Journal of Solid-State Circuits, vol. 43, No. 9, Sep. 2008.

Jihwan Kim et al., "A 16-to-40Gb/s Quarter-Rate NRZ/PAM4 Dual-Mode Transmitter in 14nm CMOS", ISSCC 2015.

Yu-Ting Lin et al., "A 50 Gb/s PAM-4 Transmitter with Feedforward Equalizer and Background Phase Error Calibration", ASSCC 2020.

Jae-Woo Park et al., "A 21Gb/s Duobinary Transceiver for GDDR interfaces with an Adaptive Equalizer", ASSCC 2021.

* cited by examiner

SEMICONDUCTOR DEVICE

CROSS-REFERENCE TO RELATED APPLICATION

This application claims priority to and the benefit of Korean Patent Application No. 10-2022-0123572, filed in the Korean Intellectual Property Office on Sep. 28, 2022, and Korean Patent Application No. 10-2022-0128762, filed in the Korean Intellectual Property Office on Oct. 7, 2022, the contents of which are incorporated herein by reference in their entireties.

BACKGROUND

1. Field

The disclosure relates to a semiconductor device.

2. Description of the Related Art

Recently, high-speed data communication is required or desired to transmit artificial intelligence, high-definition video streaming, big data, and the like. Accordingly, research to overcome a limitation of a bandwidth of a memory interface continues. A signal modulation method based on a non-return to zero (NRZ) type of encoding is difficult to satisfy a demand for high-capacity and high-speed data transmission.

SUMMARY

An example embodiment is to provide a semiconductor device that encodes a signal having a Nyquist frequency that is smaller than that of a pulse amplitude modulation (PAM)-4 encoded signal.

An example embodiment is to provide a semiconductor device that performs encoding and decoding based on a half-rate clock signal or a quarter-rate clock signal.

An example embodiment provides a semiconductor device including: an encoder configured to receive a plurality of bit data by dividing the plurality of bit data into first group data and second group data, the plurality of bit data being divided into 2-bit units, to delay the second group data for a first period, and to output the first group data and the delayed second group data; and an output driver configured to output the first group data and the delayed second group data together to an external semiconductor device.

An example embodiment provides a memory system including: a memory device configured to include a transmitter that receives a plurality of bit data from a memory cell array by dividing the plurality of bit data into first group data and second group data based on the memory cell array and duo-binary PAM-4, the plurality of bit data being divided into 2-bit units, delays the second group data for one unit interval (UI), and outputs the first group data and the delayed second group data together as a data input and output signal; and a memory configured to include a receiver that obtains current UI output data by decoding the data input and output signal for one unit interval (UI), obtains current UI PAM-4 (4 level pulse amplitude modulation) data by subtracting previous UI PAM-4 data from the current UI output data, and decodes the current UI PAM-4 data into a non-return to zero (NRZ) signal.

An example embodiment provides a memory device including: a memory cell array; a serializer configured to convert i-bit parallel data of the memory cell array into j-bit serial data (i and j being positive numbers and i>j); an encoder configured to output first bit data and second bit data of the j-bit serial data as first encoded data based on a first clock and to output third bit data and fourth bit data of the j-bit serial data as second encoded data based on a second clock having a phase difference of one unit interval from the first clock; and an output driver configured to include a first driver block that outputs the first encoded data for two unit intervals and a second driver block that outputs the second encoded data for the two unit intervals.

DETAILED DESCRIPTION OF THE EXAMPLE EMBODIMENTS

Figure 1:
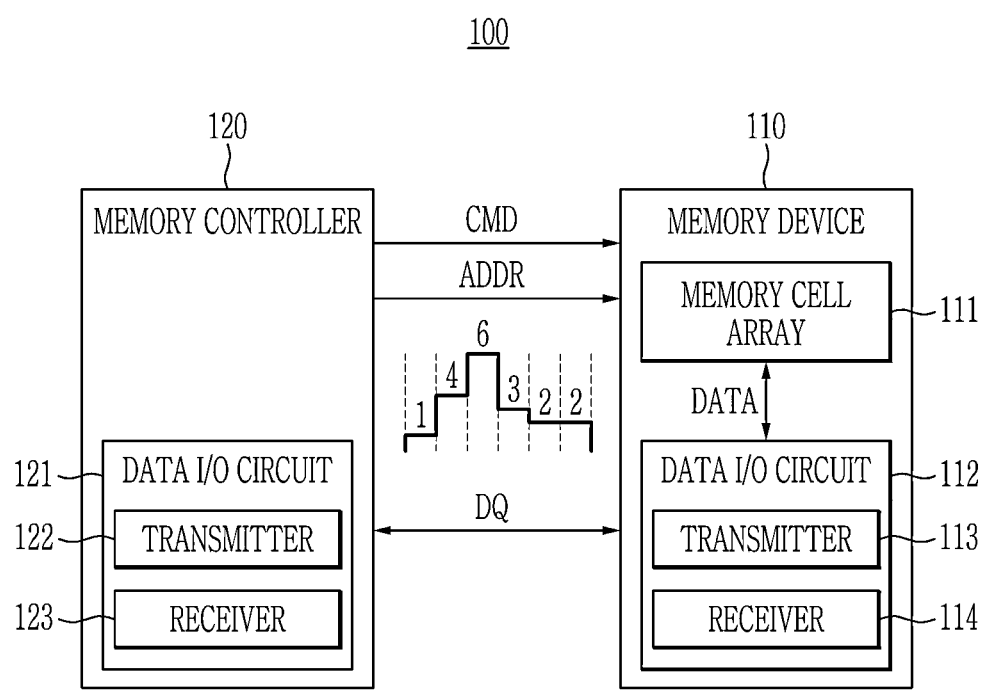
FIG. 1 illustrates a block diagram of a memory system according to some example embodiments.

In the following detailed description, only certain example embodiments of the present invention have been shown and described, simply by way of illustration. As those skilled in the art would realize, the described example embodiments may be modified in various different ways, all without departing from the spirit or scope of the present invention.

Accordingly, the drawings and description are to be regarded as illustrative in nature and not restrictive. Like reference numerals designate like elements throughout the specification. In a flowchart described with reference to the drawings, an order of operations may be changed, several operations may be merged, some operations may be divided, and specific operations may not be performed.

In addition, expressions written in the singular may be construed in the singular or plural unless an explicit expression such as "one" or "single" is used. Terms including ordinal numbers such as first, second, and the like will be used only to describe various components, and are not to be interpreted as limiting these components. These terms may be used for the purpose of distinguishing one constituent element from other constituent elements.

FIG. 1 illustrates an example block diagram of a memory system according to some example embodiments.

Referring to FIG. 1, a memory system 100 includes a memory device 110 and a memory controller 120. In some example embodiments, the memory device 110 and the memory controller 120 may be connected through a memory interface to transmit and receive signals through a memory interface.

The memory device 110 includes a memory cell array 111 and a data I/O circuit 112. The memory cell array 111 includes a plurality of memory cells connected to a plurality of rows and a plurality of columns. In some example embodiments, rows may be defined by wordlines and columns may be defined by bitlines. The data I/O circuit 112 may store data transferred from the outside in the memory cell array 111, or may output data stored in the memory cell array 111 to the outside of the memory device 110 (i.e., the memory controller 120, etc.). The data I/O circuit 112 may include a transmitter 113 and a receiver 114. The transmitter 113 may receive data DATA from the memory cell array 111 and encode it, and may output a data input/output signal DQ based on the encoded signal. In some example embodiments, a multi-symbol (or multi-level) modulation scheme may be used to modulate a signal communicated between the memory controller 120 and the memory device 110. Examples of multi-symbol modulation schemes include, but are not limited to, pulse amplitude modulation (PAM), quadrature amplitude modulation (QAM), quadrature phase shift keying (QPSK), and/or the like. A multi-symbol signal may be a signal modulated by using a modulation scheme including at least three levels to encode more than one bit of information. Multi-symbol modulation schemes and symbols may alternatively be referred to as non-binary, multi-bit, or higher order modulation schemes and symbols. For example, the transmitter 113 may include an a-bit number of symbols depending on n-level pulse amplitude modulation (PAM-n), to create and output 2a (=n) DQ that may express data values. The transmitter 113 may generate and output a DQ capable of expressing four data values (00, 01, 10, and 11) including a 2-bit number of symbols depending on PAM-4. As another example, the transmitter 113 may include a 3-bit number of symbols depending on duo-binary PAM-4 to generate and output a DQ capable of representing seven data values (000, 001, 010, 011, 100, 101, and 110). Hereinafter, it is assumed that the data I/O circuit 112 uses a duo-binary PAM-4 scheme.

In FIG. 1, the DQ is implemented as a single signal and may be transmitted or received through a single line between the memory device 110 and the memory controller 120. In some example embodiments, the DQ may be implemented as a differential signal to be transmitted or received through differential lines between the memory device 110 and the memory controller 120. The receiver 114 may receive the DQ provided from the memory controller 120, and may generate data DATA by decoding the received DQ. The receiver 114 may output the generated data DATA to the memory cell array 111. The receiver 114 of the memory device 110 is substantially the same as the receiver 123 of the memory controller 120, and thus reference is made to the following description of the receiver 123 of the memory controller 120.

The memory controller 120 controls a memory operation of the memory device 110 by providing a signal to the memory device 110. The signal may include a command CMD and an address ADDR. In some example embodiments, the memory controller 120 may provide the command CMD and the address ADDR to the memory device 110 to access the memory cell array 111 and control a memory operation such as reading or writing. According to the reading operation, data is transferred from the memory cell array 111 to the memory controller 120 as the DQ, and according to a writing operation, data may be transferred from the memory controller 120 to the memory cell array 111 as the DQ.

The memory device 110 and the memory controller 120 may transmit or receive the DQ to or from each other through serial interfacing. The memory controller 120 may access the memory device 110 depending on a request from a host outside the memory system 100. The memory controller 120 may communicate with the host by using various protocols. For example, the memory controller 120 may communicate with an external host in a parallel interfacing manner. In some example embodiments, the memory controller 120 may communicate with the host in a serial interfacing manner.

The command CMD may include an activation command, a reading/writing command, and a refresh command. The activation command may be a command for converting a target row of the memory cell array 111 to an active state in order to write data to or read data from the memory cell array 111. A memory cell of the target row may be activated (e.g., driven) in response to the activation command. The reading/writing command may be a command for performing a reading or writing operation on a target memory cell of a row switched to an active state. The refresh command may be a command for performing a refresh operation in the memory cell array 111.

When the command CMD is the reading command, the transmitter 113 may receive the data DATA from the memory cell array 111. The transmitter 113 may encode the data DATA based on the duo-binary PAM-4, and may output the encoded signal as the DQ. The transmitter 113 may divide a plurality of bit data DATA into a plurality of 2-bit group data. For example, the transmitter 113 may divide 8-bit data 11001001 into 2-bit group data 11, 00, 10, and 01. Here, depending on a division order, 00 and 01 may be first group data (e.g., even-numbered group data), and 11 and 10 may be second group data (e.g., odd-numbered group data). The transmitter 113 may output 2-bit group data for a plurality of unit intervals (UIs). For example, the transmitter 113 may output 11 as the DQ for two UIs. The transmitter 113 may delay any one of the first group data and the second group data by one UI, and may output the two group data together as the DQ. For example, when the transmitter 113 delays the second group data by one UI, the transmitter 113 may output 00 of the first group data as the DQ in a first UI to a second UI, may output 11 of the second group data as the DQ in the second UI to a third UI, may output 01 of the first group data as the DQ in the third UI to a fourth UI, and may output 10 of the second group data as DQs in the fourth UI to a fifth UI. In addition, the transmitter 113 may output 00 of the first group data as the DQ in the first UI, may output 00 of the first group data and 11 of the second group data together as the DQ in the second UI, and may output 11 of the second group data and 01 of the first group data together as a DQ in the third UI.

The data I/O circuit 121 of the memory controller 120 may output data as the DQ to the memory device 110, or may receive the DQ outputted from the memory device 110. The data I/O circuit 121 may include a transmitter 122 and a receiver 123. The transmitter 122 may transmit data provided from an external host to the memory device 110. The transmitter 122 of the memory controller 120 is substantially the same as the transmitter 113 of the memory device 110, and thus reference is made to the following description of the transmitter 113 of the memory device 110. The receiver 123 may receive the DQ, and may decode it based on the duo-binary PAM-4. In some example embodiments, the receiver 123 may generate PAM-4 data by decoding the DQ based on the duo-binary PAM-4. Specifically, the receiver 123 may obtain current UI output data by decoding the DQ in a current UI, and may obtain PAM-4 data of the current UI by subtracting the current UI output data from PAM-4 data of a previous UI. The receiver 123 may restore the DQ encoded based on duo-binary PAM-4 to PAM-4 data.

When the memory device 110 transmits the DQ at a high data rate, it is necessary to sufficiently ensure an eye opening height and an eye opening width of the DQ. The transmitter 113 according to the present disclosure outputs the DQ encoded depending on the duo-binary PAM-4, and thus an influence of crosstalk may be small, and a sufficient opening height and eye opening width may be secured. Then, a Nyquist frequency of a duo-binary PAM-4 signal is lower than a Nyquist frequency of a PAM-4 signal, and depending on the transmitter 113, it is possible to prevent or reduce a channel insertion loss in a high frequency band. The transmitter 113 performs encoding and decoding using a low frequency clock, and thus power consumption may be reduced, thereby increasing energy efficiency.

The memory device 110 may be a storage device based on a semiconductor device. In some example embodiments, the memory device 110 may include a dynamic random access memory (DRAM) device. In some example embodiments, the memory device 110 may include another volatile or non-volatile memory device in which the transmitter 113 or the receiver 114 is used.

Hereinafter, the data I/O circuit 112 of the memory device 110 will be described with reference to FIG. 2 to FIG. 9. However, a following description of the data I/O circuit 112 of the memory device 110 may be equally applied to the data I/O circuit 121 of the memory controller 120.

Figure 2:
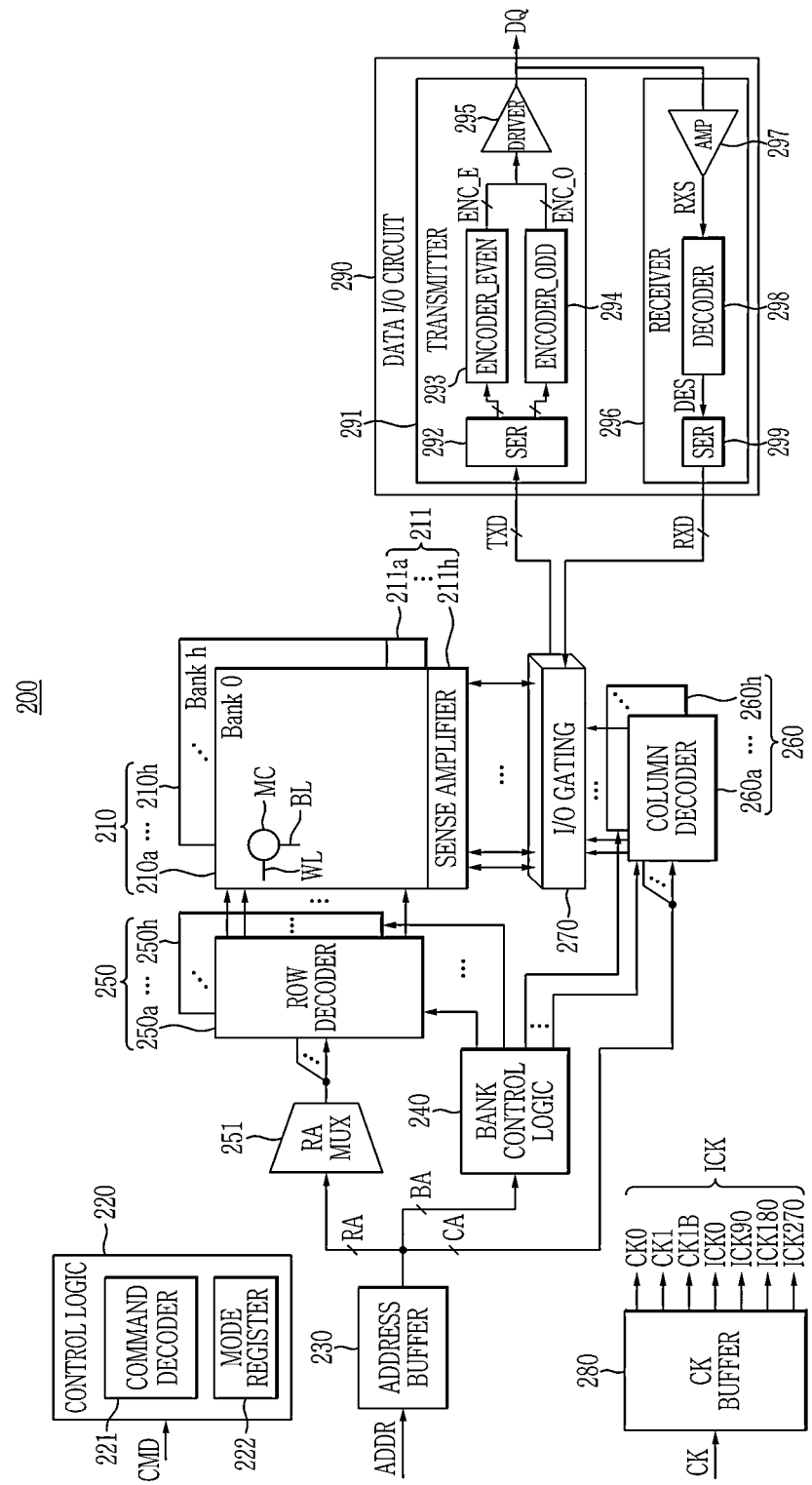
FIG. 2 illustrates a block diagram showing a memory device according to some example embodiments.

FIG. 2 illustrates a block diagram showing a memory device according to some example embodiments.

Referring to FIG. 2, the memory device 200 includes a memory cell array 210, a sense amplifier 211, a control logic circuit 220, an address buffer 230, a row decoder 250, a column decoder 260, an I/O gating circuit 270, a clock buffer 280, and a data I/O circuit 290.

The memory cell array 210 includes a plurality of memory cells MC. In some example embodiments, the memory cell array 210 may include a plurality of memory banks 210a to 210h. Although eight memory banks BANK0 to BANKh 210a to 210h are illustrated in FIG. 2, the number of memory banks is not limited thereto. Each of the memory banks 210a to 210h may include a plurality of rows, a plurality of columns, and a plurality of memory cells MC arranged at intersections of the rows and the columns. In some example embodiments, the rows may be defined by a plurality of word lines WL, and the columns may be defined by a plurality of bit lines BL.

The control logic circuit 220 controls an operation of the memory device 200. For example, the control logic circuit 220 may generate a control signal such that the memory device 200 performs a reading operation, a writing operation, an offset calibration operation, and the like. In some example embodiments, the control logic circuit 220 may include a command decoder 221. The command decoder 221 may generate a control signal by decoding the command CMD received from the memory controller (e.g., 120 of FIG. 1). In some example embodiments, the control logic circuit 220 may further include a mode register 222 for setting an operation mode of the memory device 200.

The address buffer 230 receives the address ADDR provided from the memory controller 120. The address ADDR includes a row address RA indicating a row of the memory cell array 210 and a column address CA indicating a column thereof. The row address RA is provided to the row decoder 250, and the column address CA is provided to the column decoder 260. In some example embodiments, the memory device 200 may further include a row address multiplexer 251. The row address RA may be provided to the row decoder 250 through the row address multiplexer 251. In some example embodiments, the address ADDR may further include a bank address BA indicating a memory bank. The bank address BA may be provided to the bank control logic 240.

In some example embodiments, the memory device 200 may further include a bank control logic 240 that generates a bank control signal in response to the bank address BA. The bank control logic 240 may activate the row decoder 250 corresponding to the bank address BA among a plurality of row decoders 250 in response to the bank control signal, and may activate the column decoder 260 corresponding to the bank address BA among a plurality of column decoders 260.

The row decoder 250 selects a row to be activated from among a plurality of rows of the memory cell array 210 based on the row address. To this end, the row decoder 250 may apply a driving voltage to a word line corresponding to the row to be activated. In some example embodiments, a plurality of row decoders 250a to 250h corresponding to the respective memory banks 210a to 210h may be provided.

The column decoder 260 selects a column to be activated from among a plurality of columns of the memory cell array 210 based on the column address. To this end, the column decoder 260 may activate the sense amplifier 211 corresponding to the column address CA through the I/O gating circuit 270. In some example embodiments, a plurality of column decoders 260a to 260h corresponding to the respective memory banks 210a to 210h may be provided. In some example embodiments, the I/O gating circuit 270 may gate input/output data, and may include a data latch for storing data read from the memory cell array 210 and a writing driver for writing data to the memory cell array 210. Data read from the memory cell array 210 may be sensed by the sense amplifier 211, and may be stored in the I/O gating circuit 270 (e.g., a data latch). In some example embodiments, a plurality of sense amplifiers 211a to 211h corresponding to the respective memory banks 210a to 210h may be provided.

In some example embodiments, data read from the memory cell array 210 (e.g., data stored in a data latch) may be provided to the memory controller 120 through the data I/O circuit 290. Data to be written into the memory cell array 210 may be provided from the memory controller 120 to the data I/O circuit 290, and data provided to the data I/O circuit 290 may be provided to the I/O gating circuit 270.

The clock buffer 280 may receive the clock CK. The clock buffer 280 may buffer the clock CK or divide the clock CK to generate an internal data clock ICK. For example, the clock buffer 280 may output a full-rate clock CK0 by buffering the clock CK, may output half-rate clocks CK1 and CK1B by dividing the clock CK0 into two, and may output quarter-rate clocks ICK0, ICK90, ICK180, and ICK270 by dividing each of the clocks CK1 and CK1B into two. In addition, the clock buffer 280 may further generate a clock divided into 8, a clock divided into 16, a clock divided into 32, and the like in the clock CK0 in order to serialize data. The clock buffer 280 may provide an internal data clock ICK to the data I/O circuit 290.

The data I/O circuit 290 may output or receive the DQ. The data I/O circuit 290 may include a transmitter 291 and a receiver 296. The transmitter 291 may encode data TXD transferred from the I/O gating circuit 270 based on the duo-binary PAM-4 to output it as the DQ. The receiver 296 may decode the received DQ, may restore it as a PAM-4 signal, and may transfer data RXD based on the restored signal to the I/O gating circuit 270.

In one example embodiment, the transmitter 291 may include a serializer (SER) 292, first and second encoders 293 and 294, and an output driver 295. The serializer 292 may convert the parallel data TXD transferred from the I/O gating circuit 270 into serial data depending on the internal clock ICK. For example, the serializer 292 may be an i:j serializer that converts i-bits of the parallel data TXD to j-bits of serial data (where i and j are positive numbers and i>j). The first encoder 293 may encode some of serial data to output encoded data ENC_E. The second encoder 294 may encode another some of serial data to output encoded data ENC_O. Specifically, the first encoder 293 may generate encoded data ENC_E by encoding even-numbered (e.g., 0, 2, 4, etc.) 2-bit group data among serial data, and the second encoder 294 may delay odd-numbered 2-bit group data of the serial data by 1 UI and may generate encoded data ENC_O by encoding the delayed odd-numbered (e.g., 1, 3, 5, etc.) 2-bit group data. An internal clock (e.g., ICK90) used by the first encoder 293 to output the encoded data ENC_E and an internal clock (e.g., ICK180) used by the second encoder 294 to output the encoded data ENC_O may have a phase difference of 90 degrees. The output driver 295 may receive the encoded data ENC_E and ENC_O, and may output the encoded data ENC_E and ENC_O as analog signals DQ. Each of the encoded data ENC_E and ENC_O includes four data values 00, 01, 10, and 11 as PAM-4 signals, and thus the DQ outputted by combining the two encoded data ENC_E and ENC_O may express 7 data values (00+00, 01+00, 10+00, 11+00, 11+01, 11+10, and 11+11). That is, the DQ may have seven voltage levels. For example, in some example embodiments, the transmitter 291 may further include an equalizer (not illustrated) that performs equalization to compensate for distortion of the DQ. In FIG. 2, the encoder 293 and the encoder 294 are separately illustrated, but may be displayed as one encoder.

In some example embodiments, the receiver 296 may include an amplifier 297, a decoder 298, and a deserializer (DES) 299. The amplifier 297 may generate a reception signal RXS by amplifying the DQ. In some example embodiments, the amplifier 297 may have input impedance for impedance matching with the transmitter (122 in FIG. 1). The decoder 298 may receive the reception signal RXS from the amplifier 297, and may decode the reception signal RXS based on PAM-n to generate a decoded signal DES. In some example embodiments, the decoder 298 may obtain current UI output data from the reception signal RXS received in the current UI, and may obtain PAM-4 data of a current UI by subtracting the current UI output data from the PAM-4 data of the previous UI. For example, the decoder 298 may convert the reception signal RXS having 7 voltage levels into 6-bit data by comparing it with 6 reference voltages, and may obtain the current UI output data by decoding the converted 6-bit data into 3-bits. The decoder 298 may generate current 3-bit UI PAM-4 data by subtracting previous 3-bit UI PAM-4 data from current 3-bit UI output data. Since the received DQ is a signal converted by combining two PAM-4 signals, the decoder 298 may generate one PAM-4 signal by separating the two PAM-4 signals included in the DQ. The decoder 298 may generate the decoding signal DES by converting the PAM-4 data of the current UI into an NRZ signal. In some example embodiments, the receiver 296 may further include an equalizer (not illustrated) that performs equalization to compensate for distortion of the DQ. The deserializer 223 may receive the decoded signal DES to convert it into received data RXD.

Next, the transmitter 291 according to some example embodiments will be described in detail with reference to FIG. 3 to FIG. 5.

Figure 3:
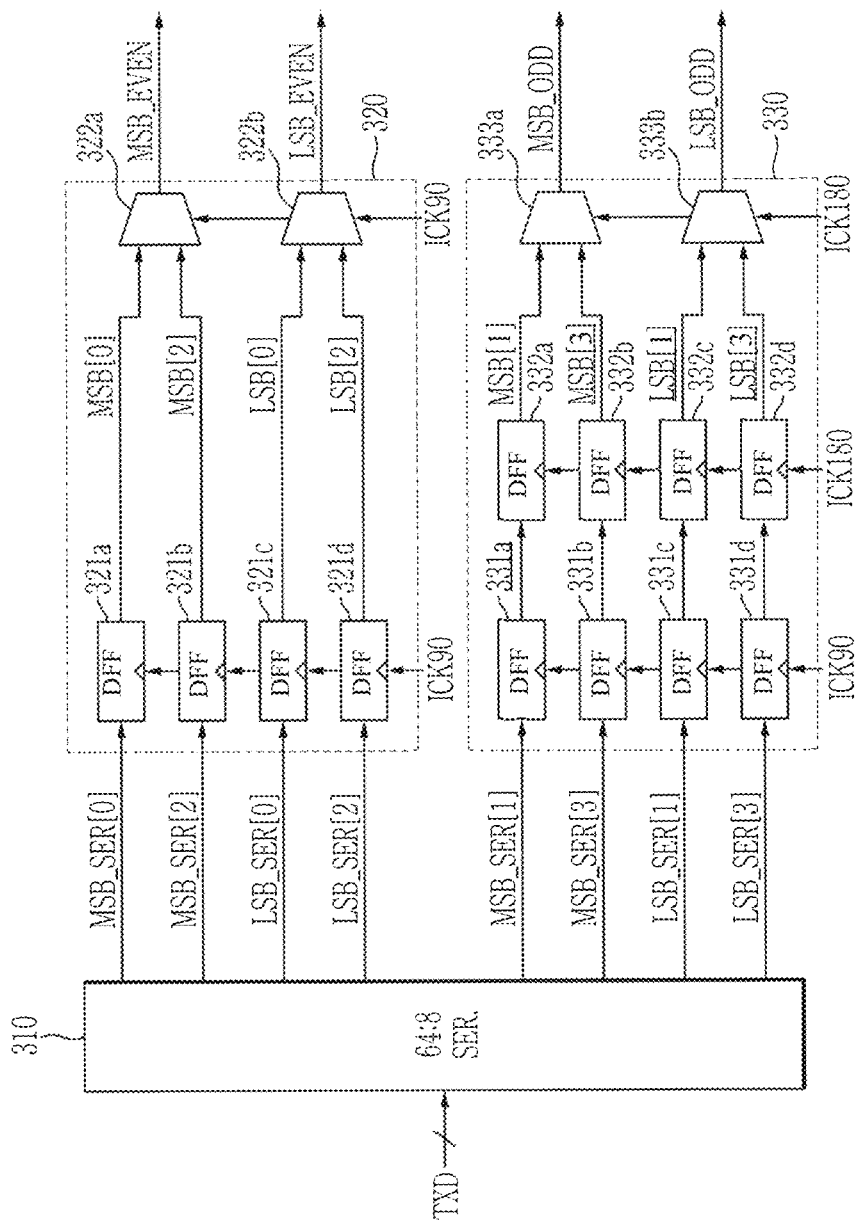
FIG. 3 illustrates a specific block diagram showing a serializer and an encoder of a transmitter according to some example embodiments.

FIG. 3 illustrates a specific block diagram showing a serializer and an encoder of a transmitter according to some example embodiments.

Referring to FIG. 3, the serializer 310 may receive 64-bit transmission data TXD, and may output 8-bit serial data MSB_SER[3:0] and LSB_SER[3:0]. For example, the serializer 310 may serialize the 64-bit transmission data TXD by using a dividing-into-32 clock. 8-bit serial data MSB_SER[3:0] and LSB_SER[3:0] outputted from the serializer 310 may be inputted to the first encoder 320 and the second encoder 330.

The first encoder 320 may include a plurality of D-flip-flops (DFF) 321a, . . . , and 321d and a plurality of multiplexers 322a and 322b. The second encoder 330 may include a plurality of D-flip-flops 331a, . . . , and 331d, 332a, . . . , and 332d and a plurality of multiplexers 333a and 333b. The 8-bit serial data MSB_SER[3:0] and LSB_SER[3:0] may be sequentially divided into four 2-bit group data depending on a bit order. Then, the 2-bit group data may include a highermost bit and a lowermost bit. A plurality of D-flip-flops 321a, . . . , and 321d of the first encoder 320 may receive even-numbered 2-bit group data MSB_SER[0], MSB_SER[2], LSB_SER[0], and LSB_SER[2] of serial data. Each of the D-flip-flops 321a, . . . , and 321d may output signals MSB[0], MSB[2], LSB[0], and LSB[2] in synchronization with the clock ICK90. A plurality of D-flip-flops 332a, . . . , and 332d of the second encoder 330 may receive odd-numbered 2-bit group data MSB_SER[1], MSB_SER[3], LSB_SER[1], and LSB_SER[3] of serial data. Each of the D-flip-flops 332a, . . . , and 332d may be synchronized with the clock ICK90 to transfer odd-numbered 2-bit group data MSB_SER[1], MSB_SER[3], LSB_SER[1], and LSB_SER[3] to the D-flip-flops 332a, . . . , and 332d. Each of the D-flip-flops 332a, . . . , and 332*d* may output signals MSB[1], MSB[3], LSB[1], and LSB[3] in synchronization with the clock ICK180.

Each of the multiplexers 322*a* and 322*b* may output one of the signals MSB[0] and MSB[2], LSB[0] and LSB[2] outputted from the two D-flip-flops 321*a* and 321*b*, 321*c* and 321*d* as the first encoded data MSB_EVEN and LSB_EVEN depending on a level of the clock ICK90. For example, the multiplexer 322*a* may output one MSB[0] of the signals MSB[0] and MSB[2] outputted from the two D-flip-flops 321*a* and 321*b* as the first encoded data MSB_EVEN when the clock ICK90 is at a logic high level, and may output one MSB[2] of the signals MSB[0] and MSB[2] outputted from the two D-flip-flops 321*a* and 321*b* as the first encoded data MSB_EVEN when the clock ICK90 is at a logic low level.

Each of the multiplexers 333*a* and 333*b* may output one of the signals MSB[1] and MSB[3], LSB[1] and LSB[3] outputted from the two D-flip-flops 332*a* and 332*b*, 332*c* and 332*d* as the second encoded data MSB_ODD and LSB_ODD depending on a level of the clock ICK180. For example, the multiplexer 333*a* may output one MSB[1] of the signals MSB[1] and MSB[3] outputted from the two D-flip-flops 332*a* and 332*b* as the second encoded data MSB_ODD when the clock ICK180 is at a logic high level, and may output one MSB[3] of the signals MSB[1] and MSB[3] output from the two D-flip-flops 332*a* and 332*b* as the second encoded data MSB_ODD when the clock ICK180 is at a logic low level.

Figure 4:
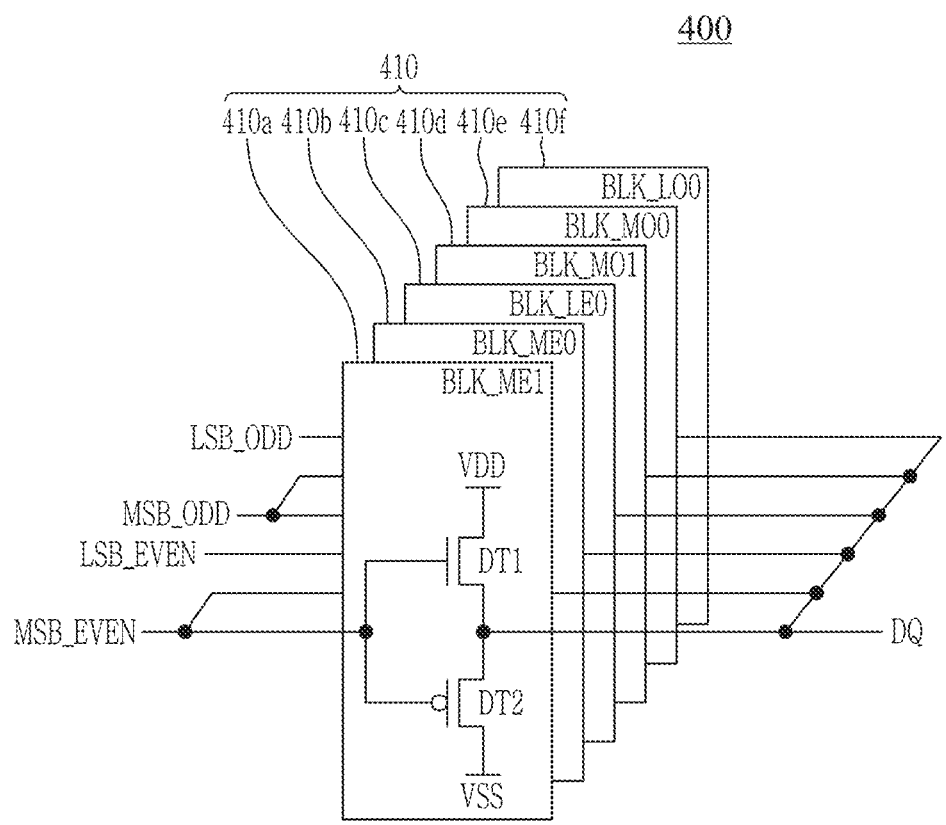
FIG. 4 illustrates a circuit diagram showing an output driver of a memory device according to some example embodiments.

FIG. 4 illustrates a circuit diagram showing an output driver of a memory device according to some example embodiments.

Referring to FIG. 4, the output driver 400 may output a DQ having a voltage level corresponding to the encoded data MSB_EVEN, LSB_EVEN, MSB_ODD, and LSB_ODD. The output driver 400 may include a plurality of driver blocks 410. Each of the driver blocks 410 may include a pull-up transistor DT1 and a pull-down transistor DT2 connected in a CMOS structure. In some example embodiments, the pull-up transistor DT1 may be an nMOS transistor, and the pull-down transistor DT2 may be a pMOS transistor. The pull-up transistor DT1 and the pull-down transistor DT2 may be connected in series between a first voltage VDD and a second voltage VSS. Encoding data MSB_EVEN, LSB_EVEN, MSB_ODD, and LSB_ODD may be inputted to gates of the pull-up transistor DT1 and the pull-down transistor DT2. Restated, the pull-up transistor DT1 and the pull-down transistor DT2 may be configured to receive at the gates of the pull-up transistor DT1 and the pull-down transistor DT2 the encoding data MSB_EVEN, LSB_EVEN, MSB_ODD, and LSB_ODD.

The output driver 400 may be configured such that a current flowing by encoding data MSB_EVEN and MSB_ODD corresponding to a highermost bit is greater than a current flowing by encoding data LSB_EVEN and LSB_ODD corresponding to a lowermost bit. For example, when sizes of the pull-up transistor DT1 and the pull-down transistor DT2 included in the driver blocks 410 are the same, a number of driver blocks 410*a*, 410*b*, 410*d*, and 410*e* to which encoding data MSB_EVEN and MSB_ODD corresponding to the highermost bit are applied may be more than a number of driver blocks 410*c* and 410*f* to which the encoding data LSB_EVEN and LSB_ODD corresponding to the lowermost bit are applied. That is, driving strength depending on the encoding data MSB_EVEN and MSB_ODD corresponding to the highermost bit may be greater than driving strength depending on the encoding data LSB_EVEN and LSB_ODD corresponding to the lowermost bit.

Figure 5:
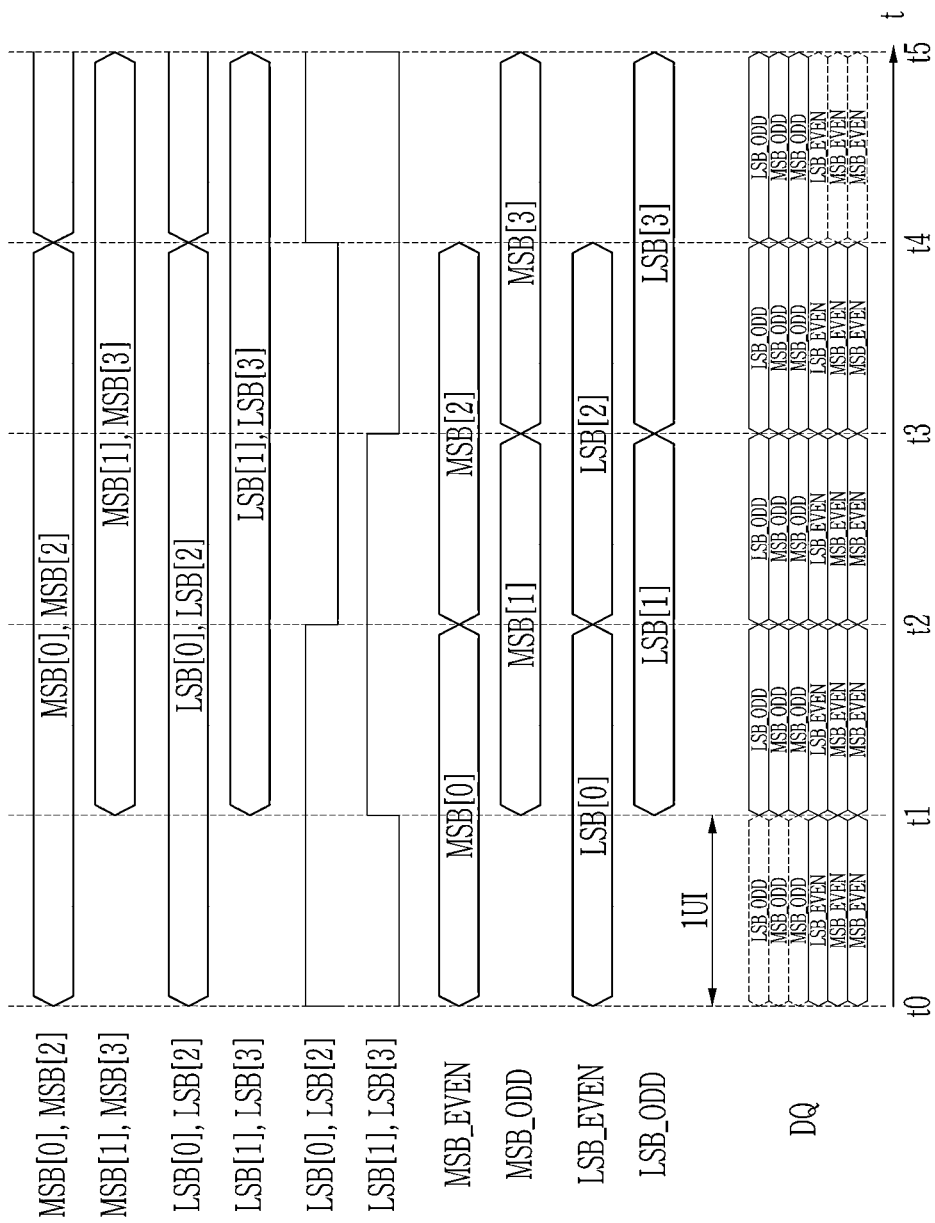
FIG. 5 illustrates input and output signals of an encoder and a driver according to some example embodiments.

FIG. 5 illustrates input and output signals of an encoder and an output driver according to some example embodiments.

Referring to FIG. 5, during a period t0 to t4, the D-flip-flops 321*a*, . . . , and 321*d* may output signals MSB[0], MSB[2], LSB[0], and LSB[2]. During a period t0 to t2, the clock ICK90 may have a logic high level, and during a period t2 to t4, the clock ICK90 may have a logic low level. The multiplexers 322*a* and 322*b* may respectively output one MSB[0] and LSB[0] of the signals MSB[0] and LSB[0] and MSB[2] and LSB[2] inputted during the period t0 to t2 as encoded data MSB_EVEN and LSB_EVEN. The multiplexers 322*a* and 322*b* may respectively output one MSB[2] and LSB[2] of the signals MSB[0] and LSB[0] and MSB[2] and LSB[2] inputted during the period t2 to t4 as encoded data MSB_EVEN and LSB_EVEN.

During the period t1 to t5, a plurality of flipflops 332*a*, . . . , and 332*d* may output signals MSB[1], MSB[3], LSB[1], and LSB[3]. During a period t1 to t3, the clock ICK180 may have a logic high level, and during a period t3 to t5, the clock ICK180 may have a logic low level. The multiplexers 333*a* and 333*b* may respectively output one MSB[1] and LSB[1] of the signals MSB[1] and LSB[1] and MSB[3] and LSB[3] inputted during the period t1 to t3 as encoded data MSB_ODD and LSB_ODD. The multiplexers 333*a* and 333*b* may respectively output one MSB[3] and LSB[3] of the signals MSB[1] and LSB[1] and MSB[3] and LSB[3] inputted during the period t3 to t5 as encoded data MSB_ODD and LSB_ODD.

In the first UI (t0 to t1), the output driver 400 may output a DQ having a voltage representing three symbols by the encoded data MSB_EVEN based on the signal MSB[0] and the encoded data LSB_EVEN based on the signal LSB[0]. In the second UI (t1 to t2), the output driver 400 may output a DQ having a voltage representing 7 symbols by encoding data MSB_EVEN based on the signal MSB[0], encoding data LSB_EVEN based on the signal LSB[0], encoding data MSB_ODD based on the signal MSB[1], and encoding data LSB_ODD based on signal LSB[1]. In the third UI (t2 to t3), the output driver 400 may output a DQ having a voltage representing 7 symbols by encoding data MSB_EVEN based on the signal MSB[2], encoding data LSB_EVEN based on the signal LSB[2], encoding data MSB_ODD based on the signal MSB[1], and encoding data LSB_ODD based on signal LSB[1]. In the fourth UI (t3 to t4), the output driver 400 may output a DQ having a voltage representing 7 symbols by encoding data MSB_EVEN based on the signal MSB[2], encoding data LSB_EVEN based on the signal LSB[2], encoding data MSB_ODD based on the signal MSB[3], and encoding data LSB_ODD based on the signal LSB[3].

Hereinafter, a duo-binary PAM-4 signal outputted by a transmitter according to some example embodiments will be described with reference to FIG. 6 to FIG. 11.

Figure 6:
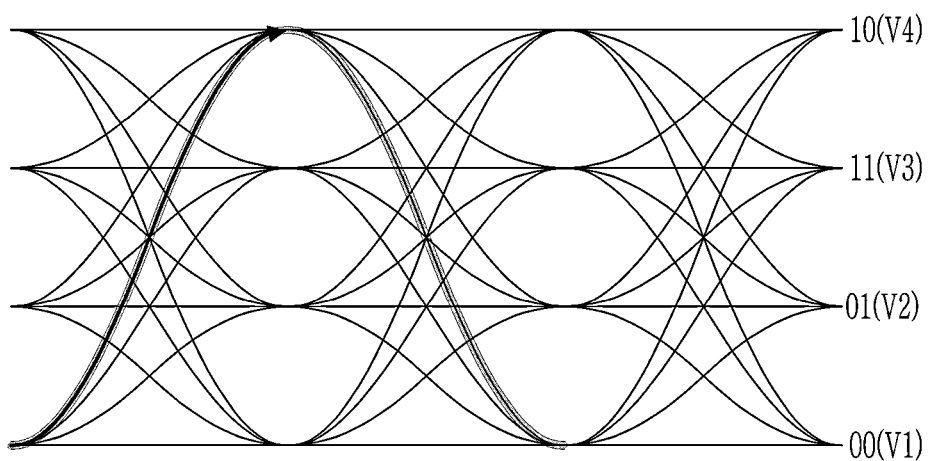
FIG. 6 illustrates a view for describing a PAM-4 signal.
Figure 7:
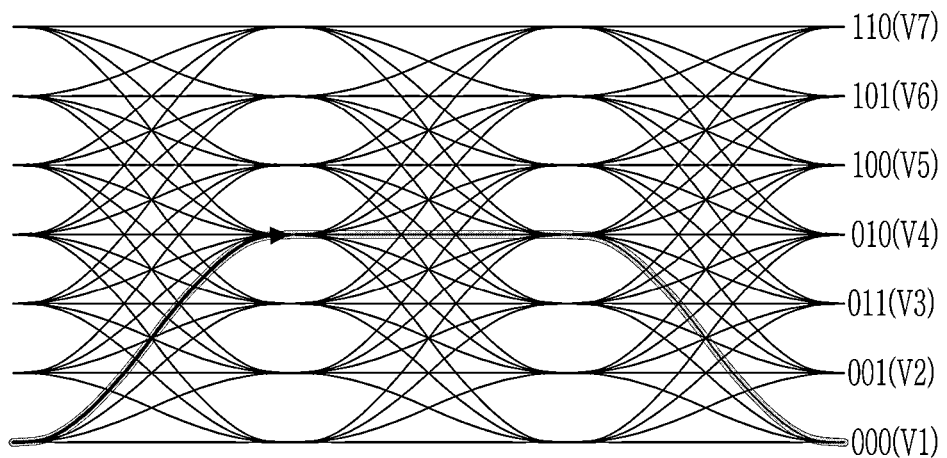
FIG. 7 illustrates a view for describing a duo-binary PAM-4 signal.
Figure 8:
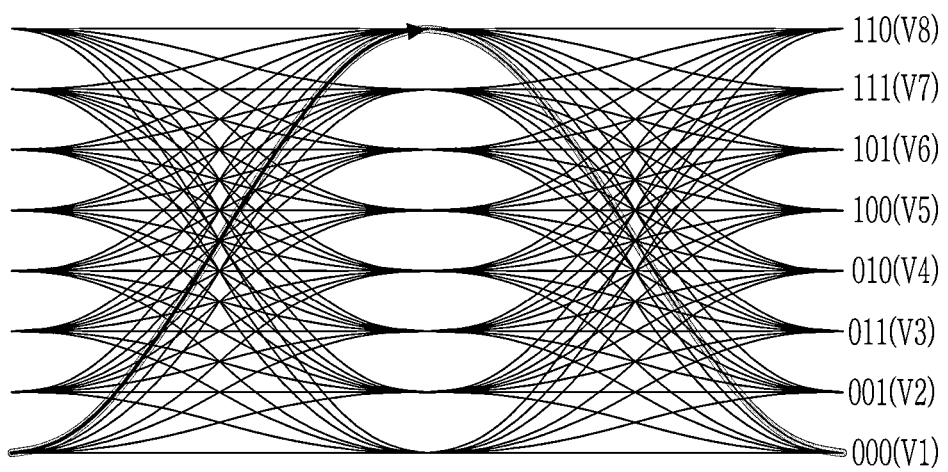
FIG. 8 illustrates a view for describing a PAM-8 signal.

FIG. 6 illustrates a view for describing a PAM-4 signal, FIG. 7 illustrates a view for describing a duo-binary PAM-4 signal, and FIG. 8 illustrates a view for describing a PAM-8 signal.

Referring to FIG. 6, since the PAM-4 signal may transition from V1 to V4 for one UI, a maximum or highest transition level of the PAM-4 signal is 3.

Referring to FIG. 7, since the duo-binary PAM-4 signal may transition from V1 to V4 for one UI, a maximum or highest transition level of the duo-binary PAM-4 signal is 3.

Referring to FIG. 8, since the PAM-8 signal may transition from V1 to V8 for one UI, a maximum or highest transition level of the PAM-8 signal is 8.

Accordingly, since the PAM-4 signal and the duo-binary PAM-4 signal have a smaller maximum or highest transition level than the PAM-8 signal, a crosstalk effect is small. In addition, voltages V1 to V7 representing 7 symbols are provided by using the duo-binary PAM-4 signal, and thus sufficient opening height and eye opening width may be ensured compared to the PAM-8 signal with voltages V1 to V8 representing 8 symbols. According to the transmitter 291 of some example embodiments, since duo-binary PAM-4 encoding is performed using a quarter-rate clock (e.g., ICK90 or ICK180), power consumption may be reduced to increase energy efficiency.

When the PAM-4 signal, the duo-binary PAM-4 signal, and the PAM-8 signal are transmitted at a same data rate, a maximum or highest frequency component of the duo-binary PAM-4 signal is equal to a maximum or highest frequency component of the PAM-8 signal.

Figure 9:
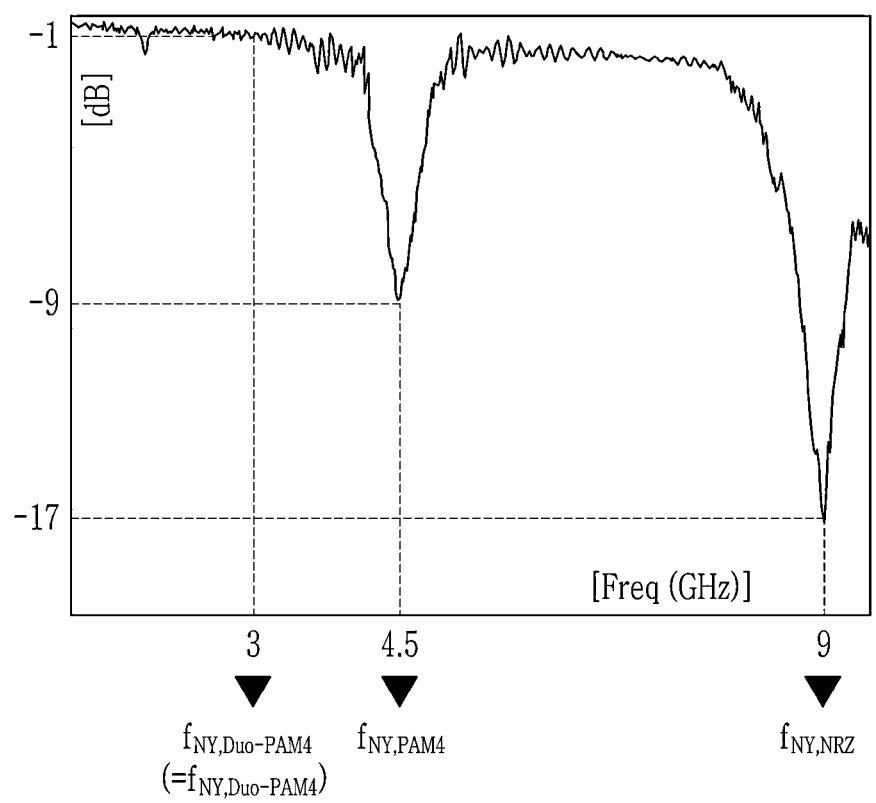
FIG. 9 illustrates a graph showing a response characteristic of a channel.

FIG. 9 illustrates a graph showing a response characteristic of a channel.

Referring to FIG. 9, an insertion loss of any channel at a transmission rate of 18 Gb/s is illustrated. A channel may have a reduced response characteristic at 4.5 GHz, which corresponds to a Nyquist frequency of the PAM-4 signal. In this case, a Nyquist frequency $f_{NY,\ Duo\text{-}PAM\text{-}4}$ of the duo-binary PAM-4 signal is at a same level as the Nyquist frequency $f_{NY,\ PAM\text{-}8}$ of the PAM-8 signal, and it is 1.5 times smaller than a Nyquist frequency $f_{NY,\ PAM\text{-}4}$ of the PAM-4 signal and 3 times smaller than a Nyquist frequency ($f_{NY,\ NRZ}$) of the NRZ signal. Accordingly, when the duo-binary PAM-4 signal is used, a channel insertion loss in a high frequency band, i.e., a 4.5 GHz band, may be prevented or reduced.

Figure 10:
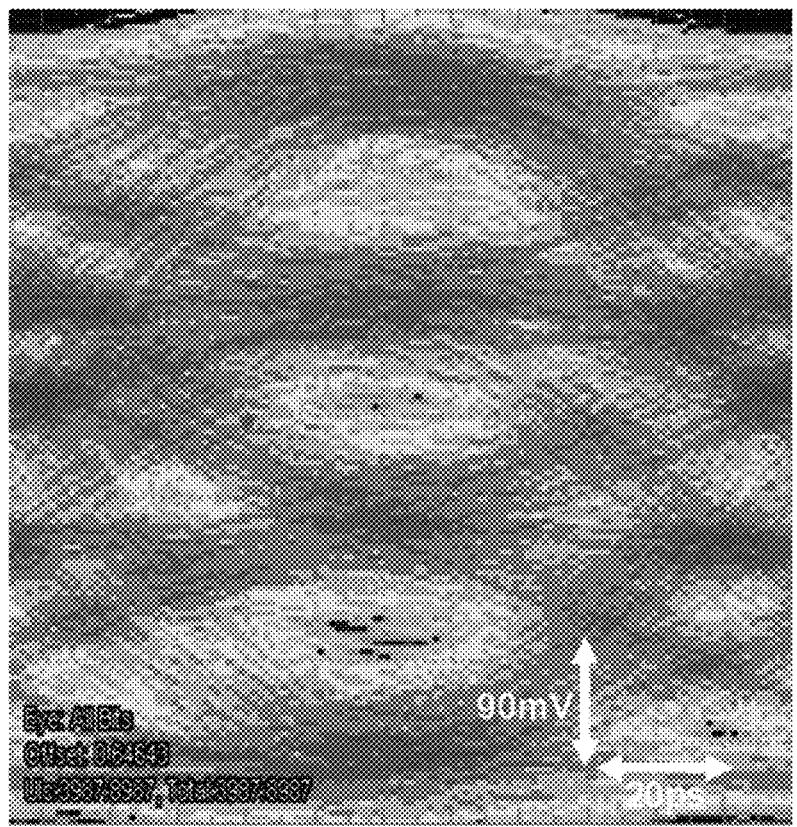
FIG. 10 illustrates an eye diagram of a PAM-4 signal after passing through a channel.
Figure 11:
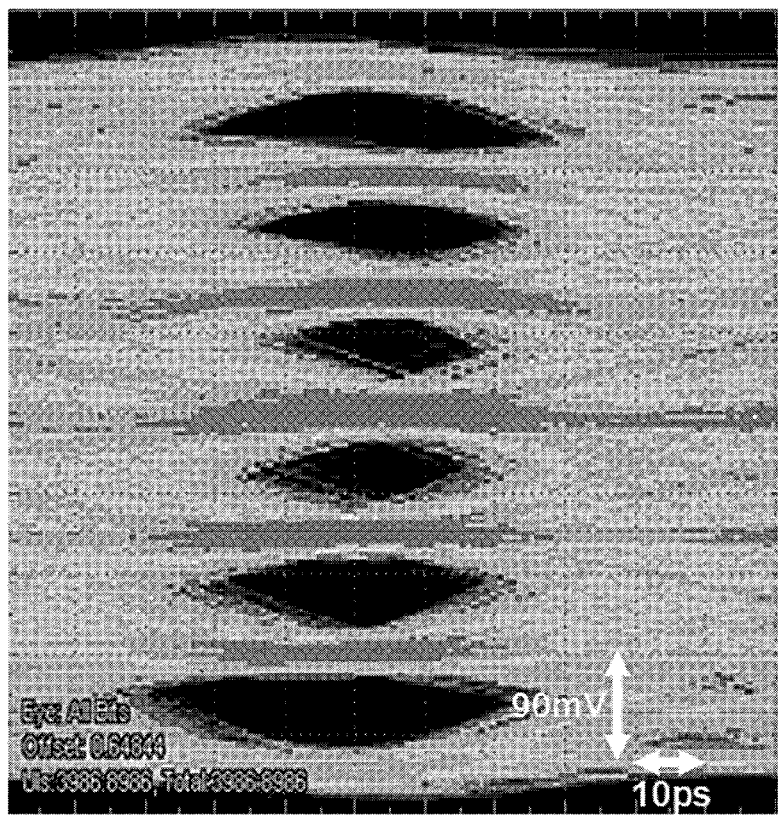
FIG. 11 illustrates an eye diagram of a duo-binary PAM-4 signal after passing through a channel.

FIG. 10 illustrates an eye diagram of a PAM-4 signal after passing through a channel, and FIG. 11 illustrates an eye diagram of a duo-binary PAM-4 signal after passing through a channel.

Referring to FIG. 10 and FIG. 11, the PAM-4 signal and the duo-binary PAM-4 signal are equalized with a gain of 2.5 Db, and may be transmitted at 18 Gb/s. It can be seen that an opening mask of an eye pattern of the duo-binary PAM-4 signal is larger than an eye pattern of the PAM-4 signal of FIG. 11.

Next, the receiver 296 according to some example embodiments will be described in detail with reference to FIG. 12 to FIG. 15.

Figure 12:
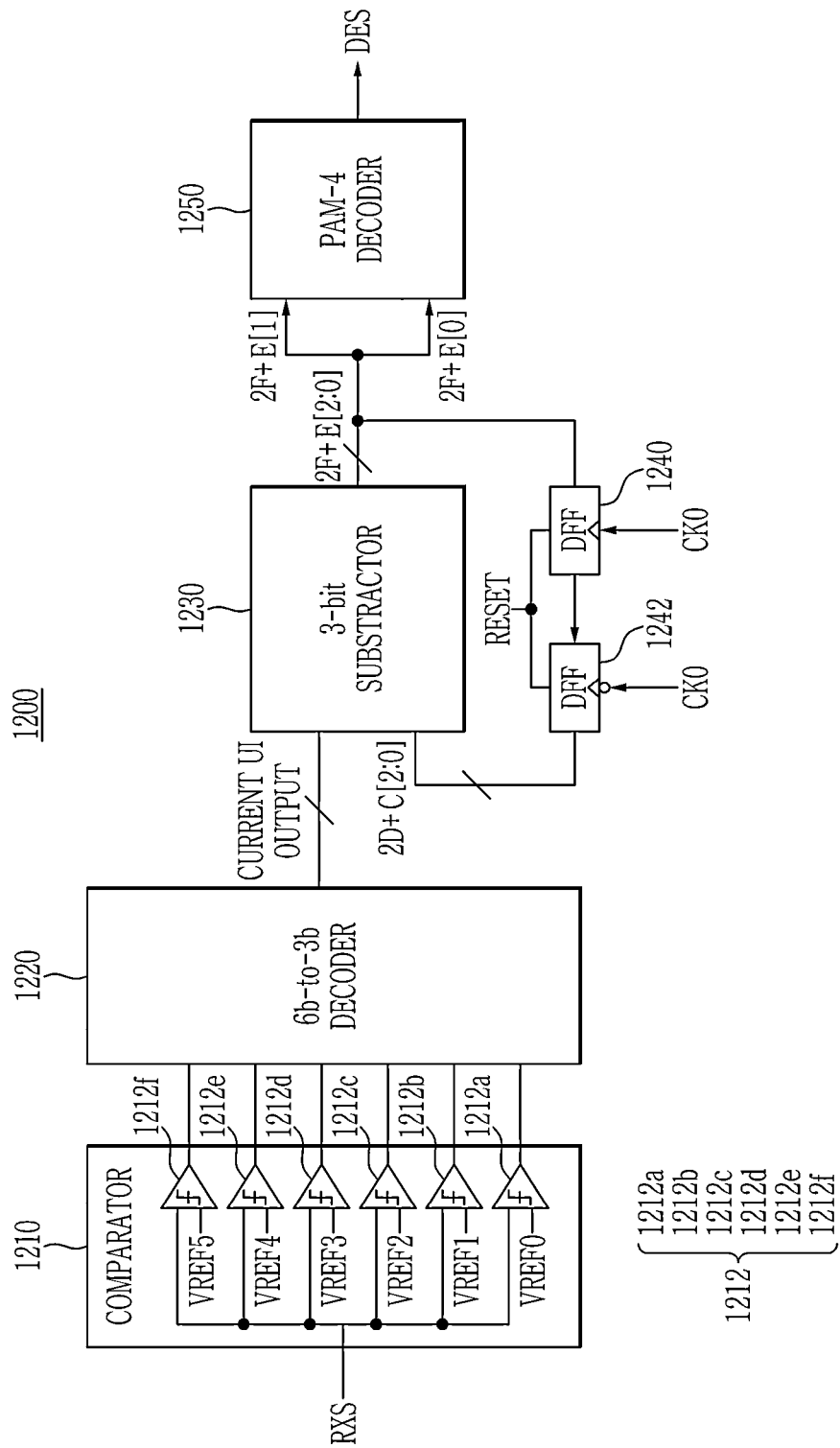
FIG. 12 illustrates a specific diagram showing a decoder of a memory device according to an embodiment.

FIG. 12 illustrates a specific diagram showing a decoder of a memory device according to some example embodiments.

Referring to FIG. 12, a decoder 1200 may receive a reception signal RXS and generate a decoding signal DES. The decoder 1200 may decode a duo-binary PAM-4 signal using a full-rate clock CK0. The decoder 1200 may include a comparator 1210, a decoder 1220, a subtractor 1230, and a PAM-4 decoder 1250.

The comparator 1210 may output an n-bit (n being a natural number) sensing signal having a value corresponding to a level of the reception signal RXS. In some example embodiments, the comparator 1210 may include a plurality of hysteresis comparators 1212. A first input terminal of each of (or alternatively, at least one of) the hysteresis comparators 1212 may receive a reception signal RXS. A second input terminal of each of (or alternatively, at least one of) the hysteresis comparators 1212 may receive corresponding reference voltages VREF0, . . . , and VREF5. Each of (or alternatively, at least one of) the hysteresis comparators 1212 may output a detection signal obtained by comparing the reception signal RXS with the corresponding reference voltages VREF0, . . . , and VREF5. For example, the hysteresis comparator 1212a may output a logic high level detection signal when the reception signal RXS is greater than the reference voltage VREF0, and detect a logic low level when the reception signal RXS is smaller than the reference voltage VREF0. Since the comparator 1210 includes six hysteresis comparators 1212, a 6-bit detection signal may be outputted. Logic levels of detection signals outputted by two hysteresis comparators to which two reference voltages adjacent to a voltage value of the reception signal RXS are inputted among the 6-bit signals may be different from each other.

The decoder 1220, which is an n-bit-to-m-bit decoder, may decode the n-bit detection signal outputted by the hysteresis comparators 1212 into m-bit (m being a natural number smaller than or equal to n) data to decode current UI output data. For example, as shown in Table 1, the decoder 1220 may generate the current UI output data by decoding the 6-bit detection signal.

TABLE 1

| detection signal (6-bit) | current UI output data (3-bit) |
|---|---|
| 000000 | 000 |
| 000001 | 001 |
| 000011 | 010 |
| 000111 | 011 |
| 001111 | 100 |
| 011111 | 101 |
| 111111 | 110 |

Figure 13:
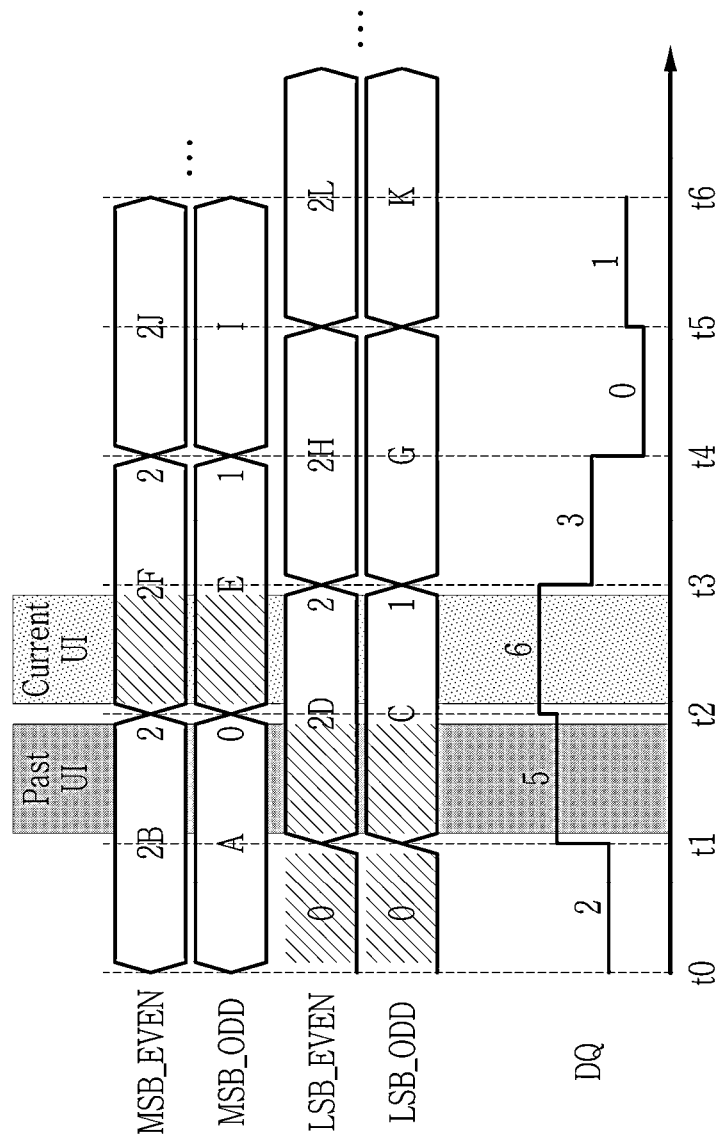
FIG. 13 illustrates input and output signals of a decoder according to some example embodiments.

The subtractor 1230, which is an m-bit subtractor, may generate current UI PAM-4 data 2F+E[2:0] by subtracting previous UI PAM-4 data 2D+C[2:0] from current UI output data CURRENT UI OUTPUT. This will be described together with reference to FIG. 13. FIG. 13 illustrates input and output signals of a decoder according to some example embodiments.

Referring to FIG. 13, DQ of the current UI may have a voltage level in which a voltage level based on the first encoded data MSB_EVEN and LSB_EVEN in the transmitter 291 and a voltage level based on the second encoded data MSB_ODD and LSB_ODD are combined. Specifically, when first encoding data MSB_EVEN is 2F, first encoding data LSB_EVEN is E, second encoding data MSB_ODD is 2D, and second encoding data LSB_ODD is C, DQ of the current UI may have a voltage level in which a voltage level according to 2F, a voltage level according to E, a voltage level according to 2D, and a voltage level according to C are combined. Accordingly, values 2D+C of the second encoding data MSB_ODD and LSB_ODD, which are the previous UI PAM-4 data, should be subtracted from the current UI output data generated from the DQ of the current UI in order to obtain values 2F+E of the first encoded data MSB_EVEN and LSB_EVEN as the current UI PAM-4 data.

The subtractor 1230 may output current UI PAM-4 data 2F+E[2:0] by subtracting the previous UI PAM-4 data 2D+C[2:0] fed back from the current UI output data CURRENT UI OUTPUT. The current UI PAM-4 data decoded based on the output data of the previous UI and the current UI output data are shown in Table 2 below.

TABLE 2

| previous UI output data | current UI output data | C | D | E | F |
|---|---|---|---|---|---|
| 2B + A + 0 (i.e., 2D + C = 0) | 0 (i.e., 2F + E = 0) | 0 | 0 | 0 | 0 |
| 2B + A + 0 (i.e., 2D + C = 0) | 1 (i.e., 2F + E = 1) | 0 | 0 | 1 | 0 |
| 2B + A + 1 (i.e., 2D + C = 1) | 1 (i.e., 2F + E = 0) | 1 | 0 | 0 | 0 |
| 2B + A + 0 (i.e., 2D + C = 0) | 2 (i.e., 2F + E = 2) | 0 | 0 | 0 | 1 |
| 2B + A + 1 (i.e., 2D + C = 1) | 2 (i.e., 2F + E = 1) | 1 | 0 | 1 | 0 |
| 2B + A + 2 (i.e., 2D + C = 2) | 2 (i.e., 2F + E = 0) | 0 | 1 | 0 | 0 |
| 2B + A + 0 (i.e., 2D + C = 0) | 3 (i.e., 2F + E = 3) | 0 | 0 | 1 | 1 |
| 2B + A + 1 (i.e., 2D + C = 1) | 3 (i.e., 2F + E = 2) | 1 | 0 | 0 | 1 |
| 2B + A + 2 (i.e., 2D + C = 2) | 3 (i.e., 2F + E = 1) | 0 | 1 | 1 | 0 |
| 2B + A + 3 (i.e., 2D + C = 3) | 3 (i.e., 2F + E = 0) | 1 | 1 | 0 | 0 |
| 2B + A + 1 (i.e., 2D + C = 1) | 4 (i.e., 2F + E = 3) | 1 | 0 | 1 | 1 |
| 2B + A + 2 (i.e., 2D + C = 2) | 4 (i.e., 2F + E = 2) | 0 | 1 | 0 | 1 |
| 2B + A + 3 (i.e., 2D + C = 3) | 4 (i.e., 2F + E = 1) | 1 | 1 | 1 | 0 |
| 2B + A + 2 (i.e., 2D + C = 2) | 5 (i.e., 2F + E = 3) | 0 | 1 | 1 | 1 |
| 2B + A + 3 (i.e., 2D + C = 3) | 5 (i.e., 2F + E = 2) | 1 | 1 | 0 | 1 |
| 2B + A + 3 (i.e., 2D + C = 3) | 6 (i.e., 2F + E = 3) | 1 | 1 | 1 | 1 |

The current UI PAM-4 data 2F+E[2:0] outputted by the subtractor 1230 may be provided to an input terminal of the subtractor 1230 through at least one D-flip-flop 1240 and 1242. The at least one D-flip-flop 1240 and 1242 re-times the current UI PAM-4 data 2F+E[2:0] in synchronization with the full-rate clock CK0, and the current UI PAM-4 data 2F+E[2:0] may be outputted to the subtractor 1230 as the previous UI PAM-4 data. At least one of the D-flip-flops 1240 and 1242 may reset latched data as a reset signal RESET is applied. The reset signal RESET may be outputted when the reception signal RXS having a predetermined or desired pattern is received. For example, the transmitter 291 may allow the reset signal RESET to be applied to the D-flip-flops 1240 and 1242 by transmitting, as a DQ, data in which a predetermined or desired number of logical values "0" are arranged at start and end times of transmission of the DQ based on the duo-binary PAM-4 signal, and the PAM-4 decoder 1250 may generate a decoding signal DES by converting the received PAM-4 data into an NRZ signal. In some example embodiments, the PAM-4 decoder 1250 may receive highermost bit data 2F+E[1] and lowermost bit data 2F+E[0] of the current UI PAM-4 data outputted from the subtractor 1230. The PAM-4 decoder 1250 generates an NRZ signal based on the highermost bit data 2F+E[1] and the lowermost bit data 2F+E[0], and may output it as the decoding signal DES.

Next, a decoder that outputs the reception signal RXS as the decoding signal DES as half-rate clocks ICK0, ICK90, ICK180, and ICK270 will be described with reference to FIG. 14 and FIG. 15.

Figure 14:
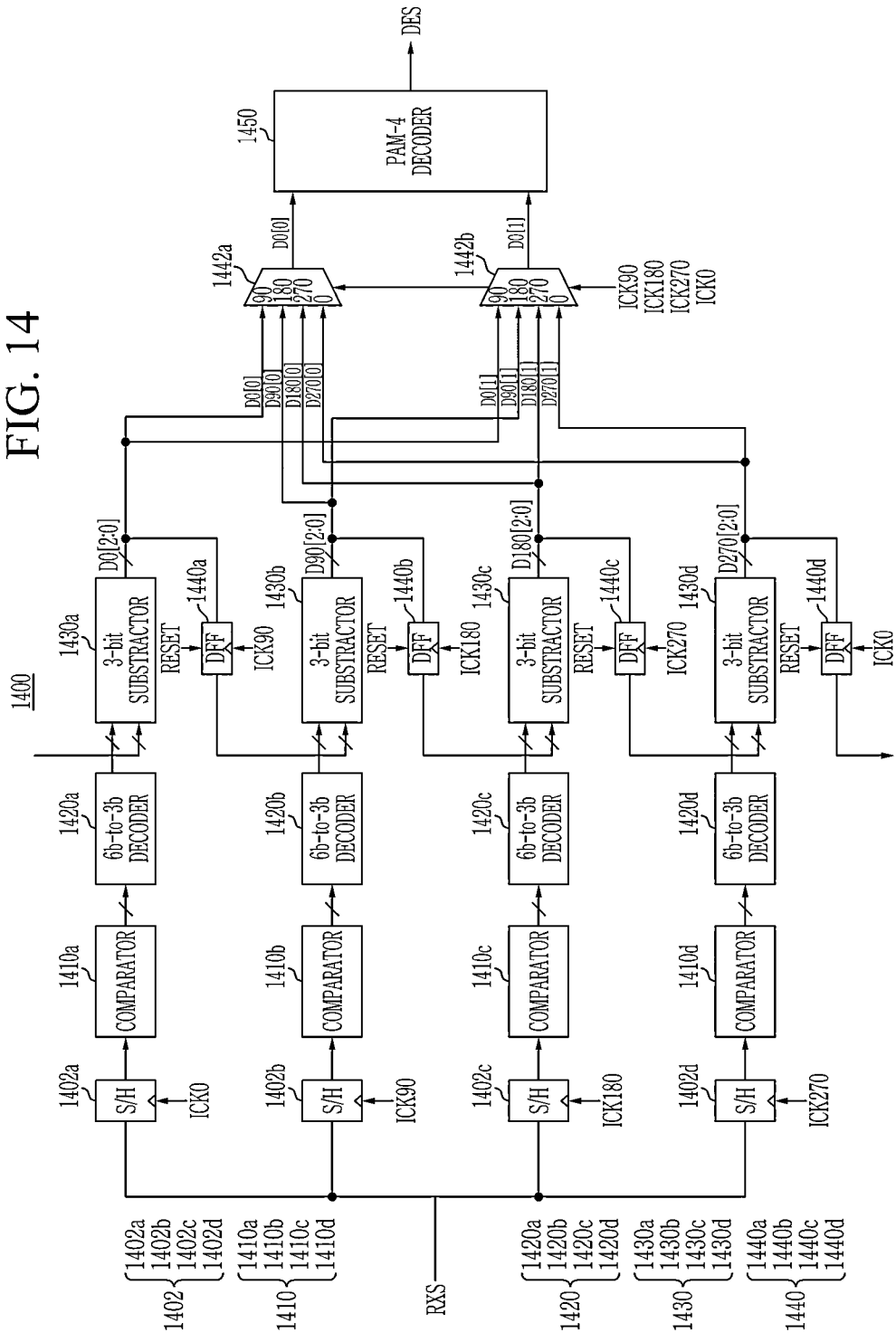
FIG. 14 illustrates a specific diagram showing a decoder of a memory device according to some example embodiments.

FIG. 14 illustrates a specific diagram showing a decoder of a memory device according to some example embodiments.

Referring to FIG. 14, a decoder 1400 may receive a reception signal RXS and generate a decoding signal DES. The decoder 1400 may decode the duo-binary PAM-4 signal by using the quarter-rate clocks ICK0, ICK90, ICK180, and ICK270. The decoder 1400 includes a plurality of sample and hold circuits 1402, a plurality of comparators 1410, a plurality of decoders 1420, a plurality of subtractors 1230, a plurality of D-flip-flops 1440, a plurality of multiplexers 1442a and 1442b, and a PAM-4 decoder 1450.

The sample and hold circuits 1402 may sample the reception signal RXS depending on the input clocks ICK0, ICK90, ICK180, and ICK270, and may hold the clocks ICK0, ICK90, ICK180, and ICK270 for one cycle.

The comparators 1410 may output a signal having a value corresponding to a level of the signal outputted by the sample and hold circuit 1402. The decoders 1420 may output current UI output data corresponding to each of the clocks ICK0, ICK90, ICK180, and ICK270 by decoding a 6-bit signal outputted by each of the comparators 1410 into 3-bit data.

Since the comparators 1410 and decoders 1420 are the same as or similar to the comparators 1210 and the decoder 1220 of FIG. 12, respectively, a description thereof will be omitted.

A plurality of subtractors 1430 may generate current UI PAM-4 data D0[2:0], D90[2:0], D180[2:0], and D270[2:0] by subtracting the previous UI PAM-4 data from the current UI output data. For example, the subtractor 1430b may receive current UI output data from the decoder 1420b. The current UI output data may be data sampled by the sample and hold circuit 1402b in synchronization with the clock ICK90. The subtractor 1430b may receive previous UI PAM-4 data D0[2:0] from the D-flip-flop 1440a in synchronization with the clock ICK90. The previous UI PAM-4 data D0[2:0] may be generated based on previous UI output data sampled in synchronization with the clock ICK0.

The D-flip-flops 1440 may synchronize the clocks ICK0, ICK90, ICK180, and ICK270 to the current UI PAM-4 data D0[2:0], D90[2:0], D180[2:0], and D270[2:0], and may output the current UI PAM-4 data D0[2:0], D90[2:0], D180[2:0], and D270[2:0] to the subtractors 1430 as old UI PAM-4 data. The D-flip-flops 1440 may reset latched data when the reset signal RESET is applied. The reset signal RESET may be outputted when the reception signal RXS having a predetermined or desired pattern is received.

The multiplexers 1442a and 1442b may selectively output outputs from the subtractors 1430 to the PAM-4 decoder 1450. Each of (or alternatively, at least one of) the multiplexers 1442a and 1442b may receive highermost bit data D0[1], D90[1], D180[1], and D270[1] and lowermost bit data D0[0], D90[0], D180[0], and D270[0] of current UI PAM-4 data D0[2:0], D90[2:0], D180[2:0], and D270[2:0] transferred in synchronization with clocks ICK0, ICK90, ICK180, and ICK270 from the subtractors 1430, and may be synchronized with the clock (ICK90, ICK180, ICK270, and ICK0 to output one data D[1] of the highermost bit data D0[1], D90[1], D180[1], and D270[1] and one data D[0] of the lowermost bit data D0[0], D90[0], D180[0], and D270 [0] to the PAM-4 decoder 1450. The multiplexers 1442a and 1242b will be described with reference to FIG. 15.

Figure 15:
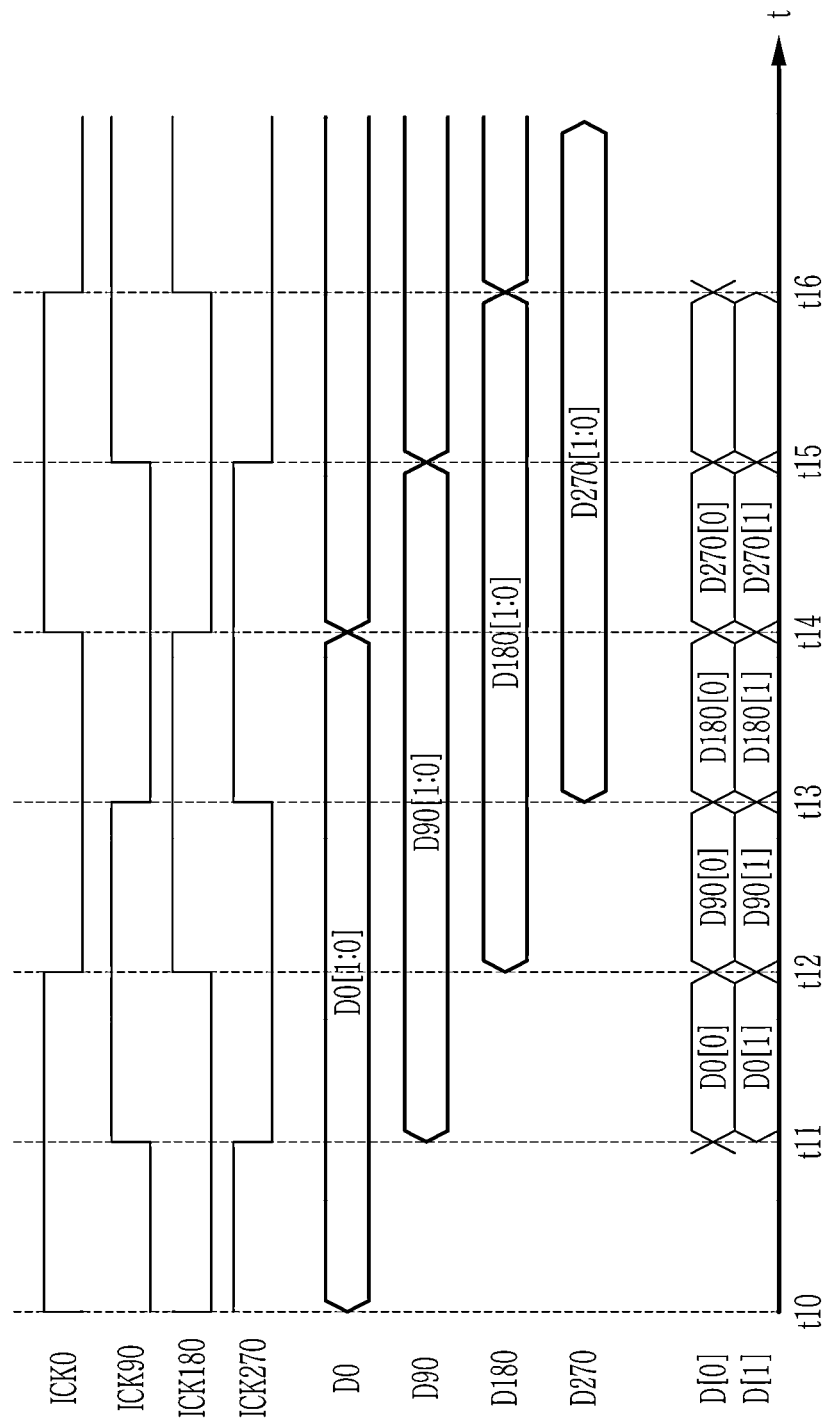
FIG. 15 illustrates input and output signals of a decoder according to some example embodiments.

FIG. 15 illustrates input and output signals of a decoder according to some example embodiments.

Referring to FIG. 15, the multiplexers 1442a and 1442b may be synchronized with first clocks ICK0, ICK90, ICK180, and ICK270 to receive the highermost bit and lowermost bit data D0[1:0], D90[1:0], D180[1:0], and D270 [1:0] of the current UI PAM-4 data, and may be synchronized with the second clocks ICK90, ICK180, ICK270, and ICK0 to output the highermost bit data D0[1], D90[1], D180[1], and D270[1] and the lowermost bit data D0[0], D90[0], D180[0], and D270[0] as the PAM-4 data D[1] and D[0]. For example, during a period t10 to t14, the highermost bit and lowermost bit data D0[1:0] of the current UI PAM-4 data transferred in synchronization with the first clock ICK0 may be inputted to a first input terminal of the multiplexers 1442a and 1442b. The multiplexers 1442a and 1442b may be synchronized with the second clock ICK90 to output the highermost bit and lowermost bit data D0[1:0] of the current UI PAM-4 data as the PAM-4 data D[1] and D[0].

The PAM-4 decoder 1450 may convert the received PAM-4 data D[1] and D[0] into an NRZ signal to generate a decoding signal DES. Since the PAM-4 decoder 1450 is the same as or similar to the PAM-4 decoder 1250 of FIG. 12, a description thereof will be omitted.

According to the decoder 1400 of some example embodiments, since duo-binary PAM-4 encoding is performed using a quarter-rate clock (e.g., ICK90 or ICK180), power consumption may be reduced to increase energy efficiency.

Figure 16:
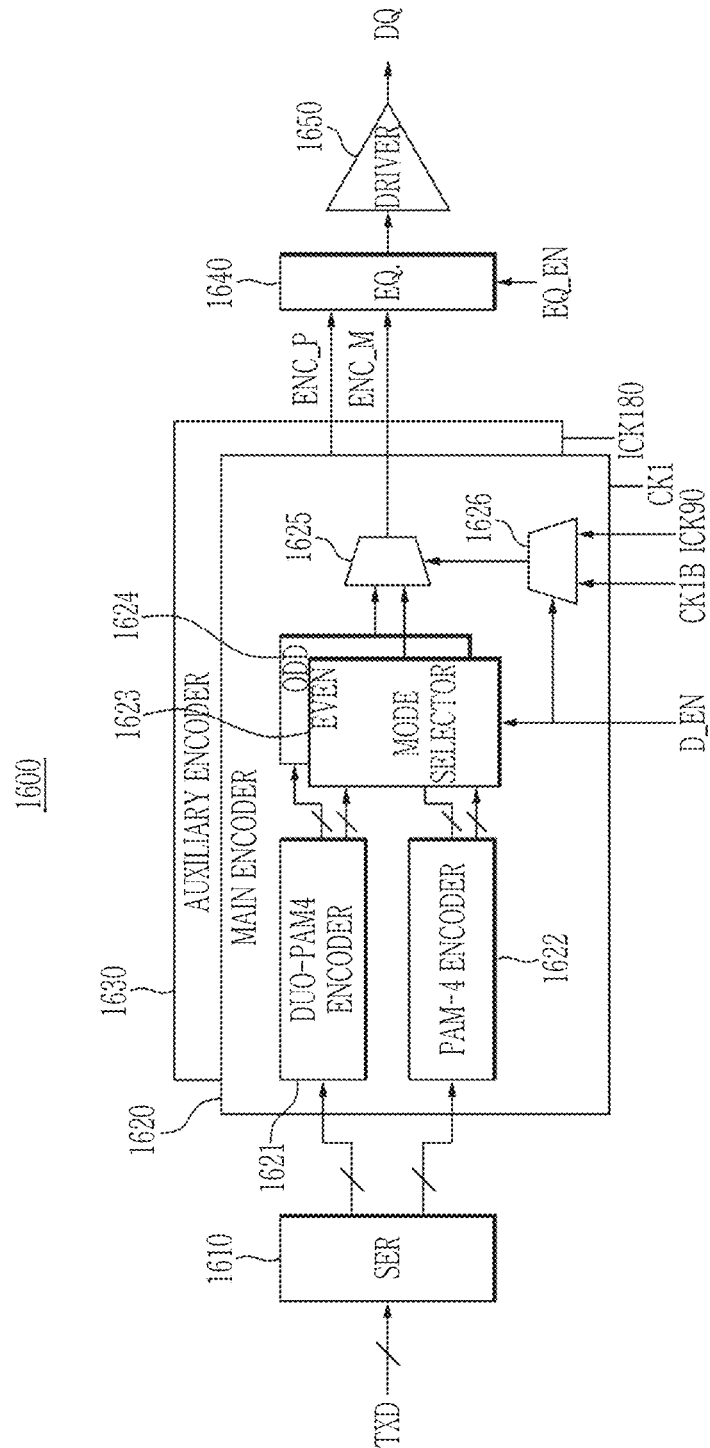
FIG. 16 illustrates a block diagram showing a transmitter according to some example embodiments.

FIG. 16 illustrates a block diagram showing a transmitter according to some example embodiments.

Referring to FIG. 16, the transmitter 1600 may selectively output DQ depending on PAM-4 and DQ depending on duo-binary PAM-4. The transmitter 1600 may encode the data TXD transferred from the I/O gating circuit 270 in FIG. 2 based on PAM-4 to output it as DQ, or may encode it based on duo-binary PAM-4 to output it as DQ.

In one example embodiment, the transmitter 1600 may include a serializer (SER) 1610, a main encoder 1620 and an auxiliary encoder 1630, an equalizer 1640, and an output driver 1650. Since the serializer 1610 is the same as or similar to the serializer 292 described in FIG. 2, a description thereof will be omitted.

The main encoder 1620 and the auxiliary encoder 1630 may include a duo-binary PAM-4 encoder 1621 and a PAM-4 encoder 1622, respectively. The auxiliary encoder 1630 may generate encoded data ENC_P for de-emphasis driving of the equalizer 1640. In some example embodiments, the encoded data ENC_P of the auxiliary encoder 1630 is delayed by 1 UI compared to the encoded data ENC_M of the main encoder 1620, and may have logical values opposite to each other. For example, the auxiliary encoder 1630 may use a clock that is 90 degrees out of phase with a clock inputted to the main encoder 1620.

The duo-binary PAM-4 encoder 1621 may encode serial data outputted from the serializer 1610 based on the duo-binary PAM-4. In some example embodiments, the duo-binary PAM-4 encoder 1621 may include the first encoder 293 and the second encoder 294 described with reference to FIG. 2. The PAM-4 encoder 1622 may encode serial data outputted from the serializer 1610 based on the PAM-4.

The main encoder 1620 and the auxiliary encoder 1630 may each include mode selectors 1623 and 1624, a selector 1625, and a clock selector 1626. The mode selectors 1623 and 1624 may selectively output data inputted from the duo-binary PAM-4 encoder 1621 and data inputted from the PAM-4 encoder 1622 based on a duo-binary mode enable signal D_EN. The selector 1625 may selectively output data inputted from the mode selector 1623 and data inputted from the mode selector 1624 based on a clock signal transferred from the clock selector 1626. The clock selector 1626 may selectively output a half-rate clock CK1B and a quarter-rate clock ICK90 based on the duo-binary mode enable signal D_EN.

The equalizer 1640 may generate a driver input signal based on the encoded data ENC_M or may generate a driver input signal based on the encoded data ENC_M and the encoded data ENC_P, on a basis of an equalization enable signal EQ_EN. The output driver 1650 may receive a driver input signal and output the driver input signal as an analog signal DQ.

According to the transmitter 1600 of some example embodiments, PAM-4 encoding or duo-binary PAM-4 encoding is selectively performed, and thus interfacing corresponding to a channel condition may be performed.

Figure 17:
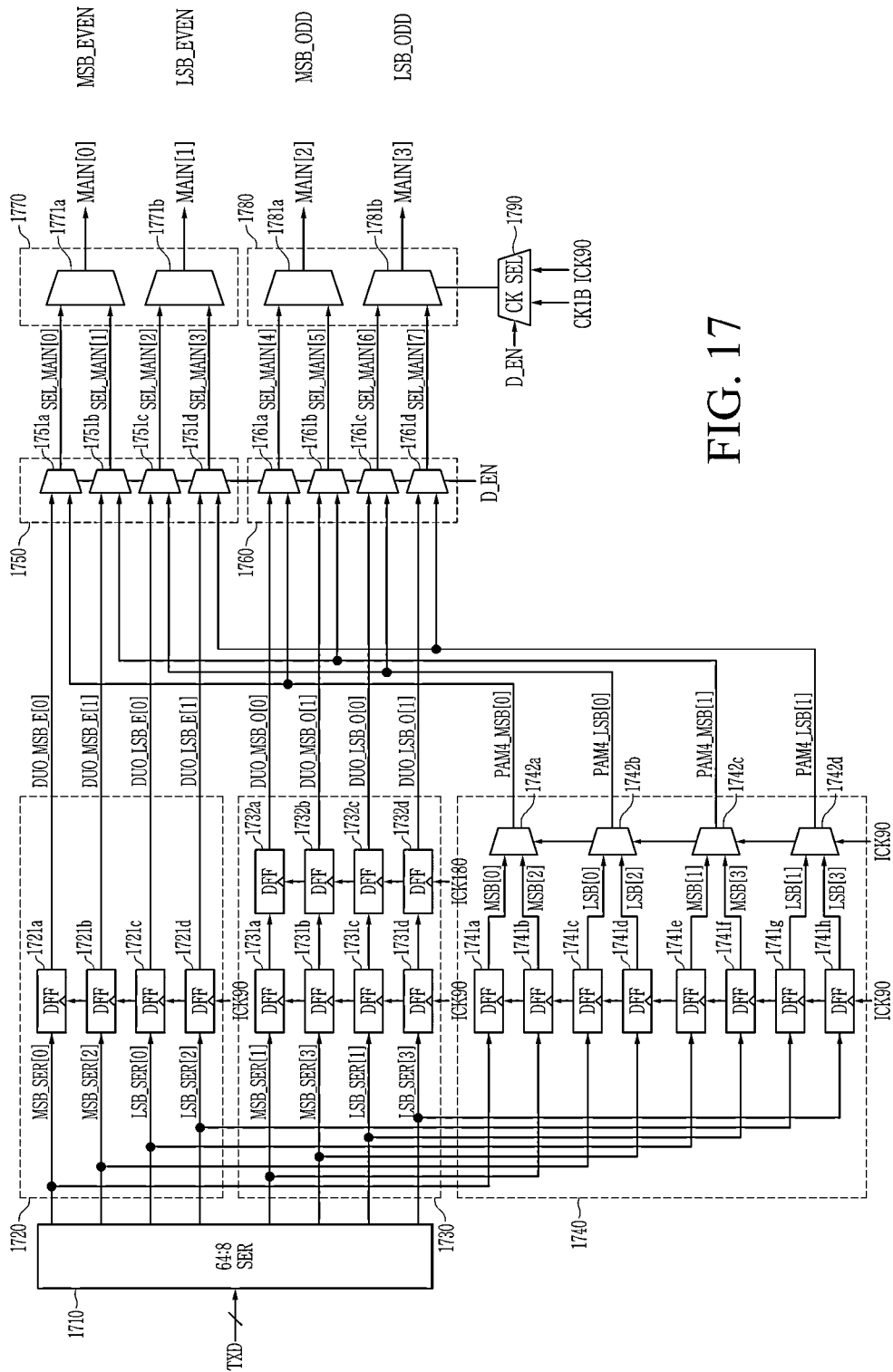
FIG. 17 illustrates a specific block diagram showing a portion of a transmitter according to some example embodiments.

FIG. 17 illustrates a specific block diagram showing a portion of a transmitter according to some example embodiments.

Referring to FIG. 17, the serializer 1710 may receive 64-bit transmission data TXD, and may output 8-bit serial data MSB_SER[3:0] and LSB_SER[3:0].

The first encoder 1720 may include a plurality of D-flip-flops 1721a, . . . , and 1721d. The second encoder 1730 may include a plurality of D-flip-flops 1731a, . . . , and 1731d, and 1732a, . . . , and 1732d. The D-flip-flops 1721a, . . . , and 1721d are the same as or similar to the D-flip-flops 321a, . . . , 321d of FIG. 3, and thus a description thereof will be omitted. The D-flip-flops 1731a, . . . , and 1731d and 1732a, . . . , and 1732d are the same as or similar to the D-flip-flops 331a, . . . , and 331d and 332a, . . . , and 332d of FIG. 3, and thus a description thereof will be omitted.

The third encoder 1740 may include a plurality of D-flip-flops 1741a, . . . , and 1741h and a plurality of multiplexers 1742a, . . . , and 1742d. The D-flip-flops 1741a, . . . , and 1741d may receive even-numbered 2-bit group data MSB_SER[0], MSB_SER[2], LSB_SER[0], and LSB_SER[2] of serial data. A plurality of D-flip-flops 1741e, . . . , and 1741h may receive odd-numbered 2-bit group data MSB_SER[1], MSB_SER[3], LSB_SER[1], and LSB_SER[3] of serial data. Each of (or alternatively, at least one of) the D-flip-flops 1741a, . . . , and 1741h may output signals MSB[0], MSB[2], LSB[0], LSB[2], MSB[1], MSB[3], LSB[1], and LSB[3] in synchronization with the clock ICK90.

Each of (or alternatively, at least one of) the multiplexers 1742a, . . . , and 1742d may output one of the signals MSB[0] and MSB[2], LSB[0] and LSB[2], MSB[1] and MSB[3], and LSB[1] and LSB[3] outputted from two D-flip-flops 1741a and 1741b, 1741c and 1741d, 1741e and 1741f, and 1741g and 1741h as PAM-4 encoded data PAM4 MSB[0], PAM4 LSB[0], PAM4 MSB[1], and PAM4 LSB[1] depending on a level of the clock ICK90.

The first mode selector 1750 may output, as selected encoding data SEL_MAIN[0], SEL_MAIN[1], SEL_MAIN[2], and SEL_MAIN[3], duo-binary PAM-4 encoded data DUO_MSB_E[0], DUO_MSB_E[1], DUO_LSB_E[0], and DUO_LSB_E[1] inputted from the first encoder 1720 or PAM-4 encoded data PAM4_MSB[0], PAM4_LSB[0], PAM4_MSB[1], and PAM4_LSB[1] inputted from the third encoder 1740 based on the duo-binary mode enable signal D_EN.

The second mode selector 1760 may output, as selected encoding data SEL_MAIN[0], SEL_MAIN[1], SEL_MAIN[2], and SEL_MAIN[3], duo-binary PAM-4 encoded data DUO_MSB_O[0], DUO_MSB_O[1], DUO_LSB_O[0], and DUO_LSB_O[0], inputted from the second encoder 1730 or PAM-4 encoded data PAM4_MSB[0], PAM4_LSB[0], PAM4_MSB[1], and PAM4_LSB[1] inputted from the third encoder 1740 based on the duo-binary mode enable signal D_EN.

The first selector 1770 may include a plurality of multiplexers 1771a and 1771b. Each of (or alternatively, at least one of) the multiplexers 1771a and 1771b may output one MAIN[0] and MAIN[1] of the selected encoding data SEL_MAIN[0] and SEL_MAIN[1], and SEL_MAIN[2] and SEL_MAIN[3] outputted from the first mode selector 1750 as the final encoded data based on the clock signal inputted from the clock selector 1790. The second selector 1780 may include a plurality of multiplexers 1771c and 1771d. Each of (or alternatively, at least one of) the multiplexers 1771c and 1771d may output one MAIN[0] and MAIN[1] of the selected encoding data SEL_MAIN[4] and SEL_MAIN[5], and SEL_MAIN[6] and SEL_MAIN[7] outputted from second mode selector 1760 as the final encoded data based on the clock signal input from the clock selector 1790. Herein, the encoded data MAIN[0] and MAIN[2] may correspond to the highermost bit data MSB_SER[0], MSB_SER[2], MSB_SER[1], and MSB_SER[3] of the serial data, and the encoded data MAIN[1] and MAIN[3] may correspond to the lowermost bit data LSB_SER[0], LSB_SER[2], LSB_SER[1], and LSB_SER[3].

The clock selector 1790 may selectively output a half-rate clock CK1B and a quarter-rate clock ICK90 based on the duo-binary mode enable signal D_EN.

In the above, the first encoder 1720, the second encoder 1730, the third encoder 1740, the first mode selector 1750, the second mode selector 1760, the first selector 1770, and the clock selector 1790 are components of the main encoder 1620 of FIG. 16, and the auxiliary encoder 1630 of FIG. 16 may have same or similar components as the main encoder 1620. Compared to the main encoder 1620, the auxiliary encoder 1630 may receive the clock ICK180 instead of the clock ICK90, may receive the clock ICK270 instead of the clock ICK180, and may receive the clock CK1 instead of the clock CK1B.

Figure 18:
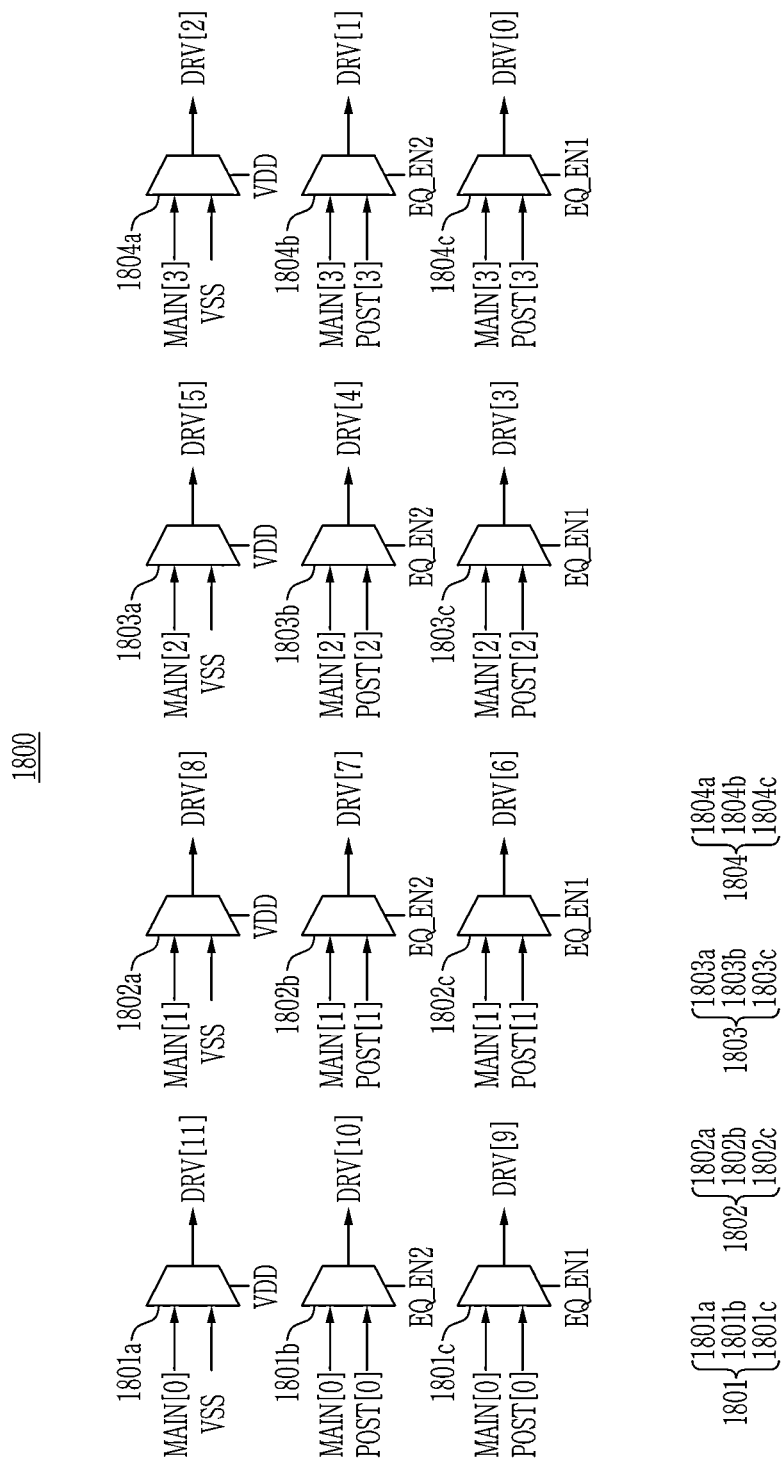
FIG. 18 illustrates a specific block diagram showing an equalizer of a transmitter according to some example embodiments.

FIG. 18 illustrates a specific block diagram showing an equalizer of a transmitter according to some example embodiments.

Referring to FIG. 18, the equalizer 1800 may generate a driver input signal DRV[11:0] based on final encoded data MAIN[0], MAIN[1], MAIN[2], and MAIN[3] outputted from the main encoder 1620 and final encoded data POST[0], POST[1], POST[2], and POST[3] outputted from the auxiliary encoder 1630. The equalizer 1800 may include a plurality of selectors 1801 and 1802 corresponding to the highermost bit data and a plurality of selectors 1803 and 1804 corresponding to the lowermost bit data.

First selectors 1801*a*, 1802*a*, 1803*a*, and 1804*a* may output final encoded data MAIN[0], MAIN[1], MAIN[2], and MAIN[3] as driver input signals DRV[11], DRV[8], DRV[5], and DRV[2].

Second selectors 1801*b*, 1801*c*, 1802*b*, 1802*c*, 1803*b*, 1803*c*, 1804*b*, and 1804*c* may output the final encoded data MAIN[0], MAIN[1], MAIN[2], and MAIN[3] or the final encoded data POST[0], POST[1], POST[2], and POST[3] as driver input signals DRV[10:9], DRV[7:6], DRV[4:3], and DRV[1:0] based on the equalization enable signals EQ_EN1 and EQ_EN2.

Figure 19:
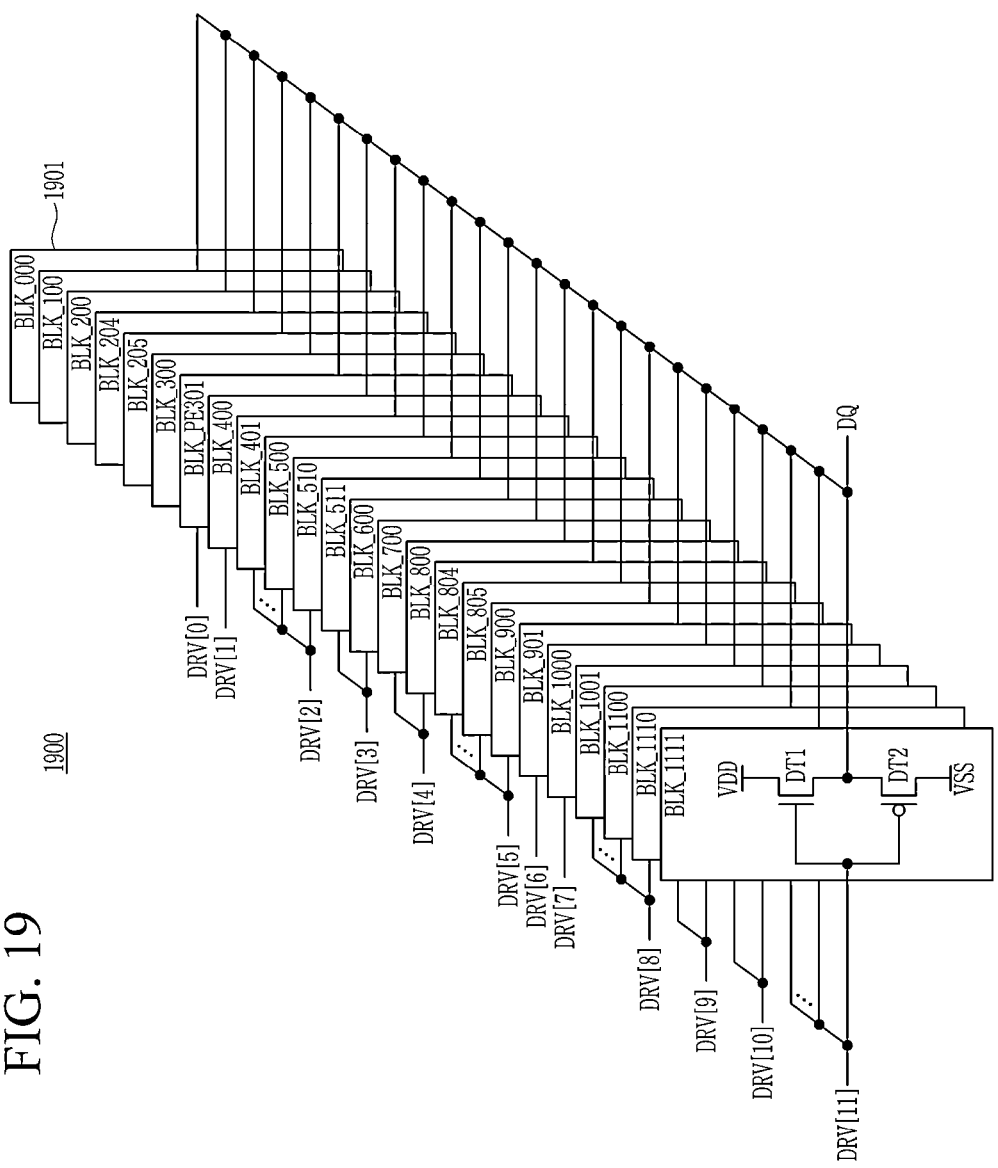
FIG. 19 illustrates a circuit diagram showing an output driver of a memory device according to some example embodiments.

FIG. 19 illustrates a circuit diagram showing an output driver of a memory device according to some example embodiments.

Referring to FIG. 19, the output driver 1900 may output DQ having a voltage level corresponding to the driver input signal DRV[11:0]. The output driver 1900 may include a plurality of driver blocks 1901. Each of (or alternatively, at least one of) the driver blocks 1901 may include a pull-up transistor DT1 and a pull-down transistor DT2 connected in a CMOS structure.

The output driver 1900 may be configured such that a current flowing by encoding data MSB_EVEN and MSB_ODD corresponding to a highermost bit is greater than a current flowing by encoding data LSB_EVEN and LSB_ODD corresponding to a lowermost bit. For example, a number of driver blocks 1901 to which driver input signals DRV[11] and DRV[5] corresponding to the highermost bit data are inputted may be greater than a number of driver blocks 1901 to which the driver input signals DRV[8] and DRV[2] corresponding to lowermost bit data are inputted.

Figure 20:
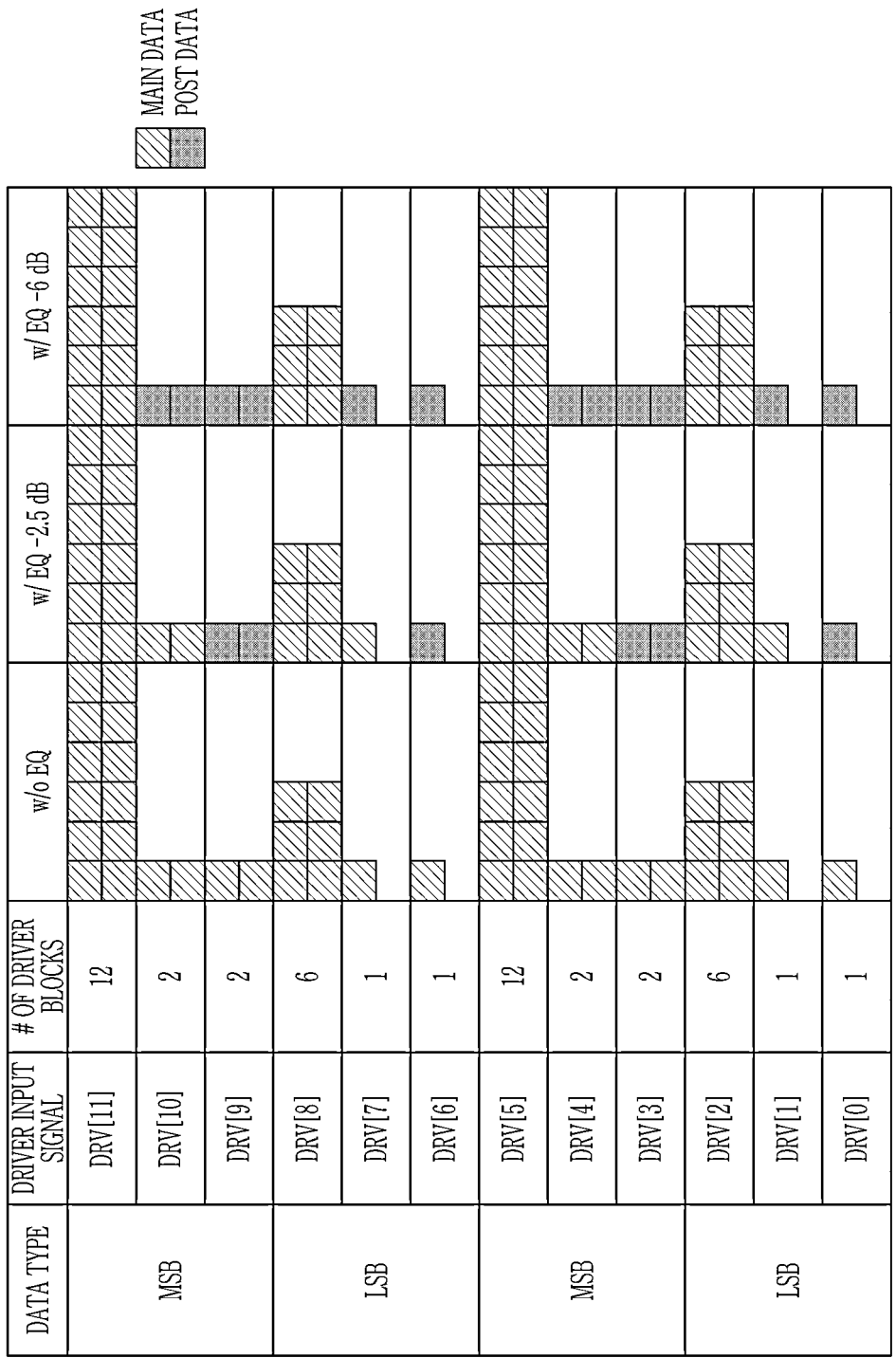
FIG. 20 illustrates a table showing an output signal of an output driver of a memory device according to some example embodiments.

FIG. 20 illustrates a table showing an output signal of an output driver of a memory device according to some example embodiments.

Referring to FIG. 20, a number of driver blocks may vary depending on the driver input signal DRV[11:0]. For example, the number of driver blocks to which driver input signals DRV[11] and DRV[5] corresponding to the highermost bit data are inputted may be 12, the number of driver blocks to which the driver input signals DRV[8] and DRV[2] corresponding to the lowermost bit data are inputted may be 6, the number of driver blocks to which the driver input signals DRV[10:9] and DRV[4:3] are inputted may be 2, and the number of driver blocks to which the driver input signals DRV[7:6] and DRV[1:0]) are inputted may be one.

When equalization is not performed, all driver blocks may output DQ based on the final encoded data MAIN[0], MAIN[1], MAIN[2], and MAIN[3] outputted from the main encoder 1620 (FIG. 16).

When equalization is performed by changing the equalization enable signal EQ_EN1 to an enable level, second selectors 1801*c*, 1802*c*, 1803*c*, and 1804*c* of FIG. 18 may output the driver input signal DRV[9], DRV[6] DRV[3], and DRV[0] and the final encoded data POST[0], POST[1], POST[2], and POST[3] outputted from the auxiliary encoder 1630. Then, some driver blocks may output DQ based on the driver input signals DRV[9], DRV[6] DRV[3], and DRV[0], so that de-emphasis driving may be performed.

When all of the equalization enable signals EQ_EN1 and EQ_EN2 are changed to the enable level to perform equalization, second selectors 1801*b*, 1801*c*, 1802*b*, 1802*c*, 1803*b*, 1803*c*, 1804*b*, and 1804*c* in FIG. 18 may output the driver input signals DRV[10:9], DRV[7:6] DRV[4:3], and DRV[1:0] and the final encoded data POST[0], POST[1], POST[2], and POST[3] outputted from the auxiliary encoder 1630. Then, some driver blocks may output DQ based on the driver input signals DRV[10:9], DRV[7:6] DRV[4:3], and DRV[1:0], so that de-emphasis driving may be performed.

Figure 21:
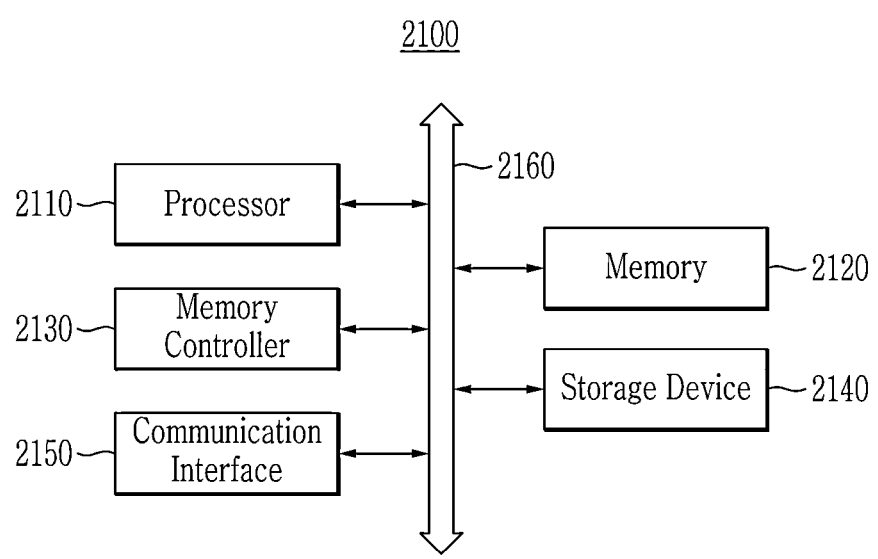
FIG. 21 illustrates an example block diagram showing a computer system according to some example embodiments.

FIG. 21 illustrates an example block diagram showing a computer system according to some example embodiments.

Referring to FIG. 21, a computing system 2100 includes a processor 2110, a memory 2120, a memory controller 2130, a storage device 2140, a communication interface 2150, and a bus 2160. The computing system 2100 may further include other general-purpose components.

The processor 2110 controls an overall operation of each component of the computing system 2100. The processor 2110 may be implemented as at least one of various processing units such as a central processing unit (CPU), an application processor (AP), and a graphics processing unit (GPU).

The memory 2120 stores various data and commands. The memory 2120 may be implemented as a memory device described with reference to FIG. 1 to FIG. 15. The memory controller 2130 controls the transfer of data or commands to and from the memory 2120. The memory controller 2130 may be implemented as the memory controller described with reference to FIG. 1 to FIG. 15. In some example embodiments, the memory controller 2130 may be provided as a separate chip from the processor 2110. In some example embodiments, the memory controller 2130 may be provided as an internal component of the processor 2110. Each of (or alternatively, at least one of) the memory 2120 and the memory controller 2130 may perform duo-binary PAM-4 encoding and decoding to transmit and receive data. Each of (or alternatively, at least one of) the memory 2120 and the memory controller 2130 may divide a plurality of bits of data to be transmitted according to FIG. 1 to FIG. 15 into a plurality of 2-bit group data, may output 2-bit group data for a plurality of UIs, may delay any one of first group data and second group data by one UI, and may output two groups of data together as DQ. In addition, each of (or alternatively, at least one of) the memory 2120 and the memory controller 2130 may obtain current UI output data by decoding the DQ in a current UI, and may obtain PAM-4 data of the current UI by subtracting the current UI output data from PAM-4 data of a previous UI.

The storage device 2140 non-temporarily stores programs and data. In some example embodiments, the storage device 2140 may be implemented as a non-volatile memory. The communication interface 2150 supports wired or wireless Internet communication of the computing system 2100. In addition, the communication interface 2150 may support various communication methods other than Internet communication. The bus 2160 provides a communication function between components of the computing system 2100. The bus 2160 may include at least one type of bus depending on a communication protocol between components.

In some example embodiments, each component or combinations of two or more components described with reference to FIG. 1 to FIG. 21 may be implemented as a digital circuit, a programmable or non-programmable logic device or array, an application specific integrated circuit (ASIC), or the like.

Any of the elements and/or functional blocks disclosed above may include or be implemented in processing circuitry such as hardware including logic circuits; a hardware/software combination such as a processor executing software; or a combination thereof. For example, the memory controller 120, control logic circuit 220, processor 2110, and memory controller 2130 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. A semiconductor device comprising:
   an encoder configured to
   receive a plurality of bit data and divide the plurality of bit data into first group data and second group data, the plurality of bit data being divided into 2-bit units,
   delay the second group data for a first period, and
   output the first group data and the delayed second group data; and
   an output driver configured to output the first group data and the delayed second group data together to an external semiconductor device.

2. The semiconductor device of claim 1, wherein the encoder is configured to output the first group data in synchronization with a first clock and output the second group data in synchronization with a second clock having a phase difference to the first clock based on the first period.

3. The semiconductor device of claim 2, further comprising:
   an amplifier configured to amplify a signal received from the external semiconductor device and to output the amplified signal as a reception signal; and
   a decoder configured to
   obtain current UI output data by decoding the reception signal for one unit interval (UI),
   obtain current UI PAM-4 (4-level pulse amplitude modulation) data by subtracting previous UI PAM-4 data from the current UI output data, and
   decode the current UI PAM-4 data into a non-return to zero (NRZ) signal.

4. The semiconductor device of claim 3, wherein the decoder includes:
   a comparator configured to compare the reception signal with each of a plurality of reference voltages, and to output an n-bit detection signal having a value corresponding to a level of the reception signal;
   an n-bit-to-m-bit decoder configured to convert the n-bit detection signal into m-bits of the current UI output data;
   an m-bit subtractor configured to output the current UI PAM-4 data by subtracting the previous UI PAM-4 data from the current UI output data; and
   at least one D-flip-flop configured to retime the current UI PAM-4 data to provide the current UI PAM-4 data to the m-bit subtractor.

5. The semiconductor device of claim 4, wherein the at least one D-flip-flop is configured to retime the current UI PAM-4 data based on a third clock having a frequency of four times the frequency of the first clock and the second clock.

6. The semiconductor device of claim 4, wherein the at least one D-flip-flop is configured to reset in response to the reception signal having a first pattern.

7. The semiconductor device of claim 3, wherein the decoder includes:
   a plurality of sample and hold circuits, wherein each sample and hold circuit is configured to sample and hold the reception signal by using a corresponding one of a plurality of internal clocks as a first internal clock;
   a plurality of comparators, wherein each comparator is configured to output an n-bit detection signal having a value corresponding to a signal level outputted by a corresponding one of the plurality of sample and hold circuits;
   a plurality of n-bit-to-m-bit decoders, wherein each n-bit-to-m-bit decoder is configured to convert a corresponding n-bit detection signal into m-bits of a corresponding current UI output data (n and m being positive numbers and n>m);
   a plurality of m-bit subtractors, wherein each m-bit subtractor is configured to output a corresponding current UI PAM-4 data by subtracting the previous UI PAM-4 data from the current UI output data;
   a plurality of D-flip-flops, wherein each D-flip-flop is configured to provide the corresponding current UI PAM-4 data to a corresponding one of the m-bit subtractors by using a corresponding another one of plurality of the internal clocks as a second internal clock; and a plurality of multiplexers, wherein each multiplexer is configured to include a plurality of input terminals and an output terminal, each multiplexer is connected to a corresponding one of the plurality of m-bit subtractors, and is configured to output one selected, depending on the internal clocks, among a plurality of current UI PAM-4 data received at the input terminals, to the output terminal.

8. The semiconductor device of claim 7, wherein
a phase difference between a third internal clock among the plurality of internal clocks used as the first internal clock and a fourth internal clock among the plurality of internal clocks used as the second internal clock is 90 degrees.

9. The semiconductor device of claim 7, wherein
a phase difference between a third internal clock among the plurality of internal clocks used to sample the reception signal and a fourth internal clock among the plurality of internal clocks used to output the current UI PAM-4 data generated by the reception signal to one output terminal is 90 degrees.

10. The semiconductor device of claim 3, wherein
the one unit interval is a second period of a same length as the first period.

11. The semiconductor device of claim 2, wherein
the first clock and the second clock are quarter-rate clocks, and the phase difference between the first clock and the second clock is 90 degrees.

12. The semiconductor device of claim 1, wherein
the plurality of bit data is divided into the first group data and the second group data by alternating in 2-bit units.

13. The semiconductor device of claim 1, wherein
the output driver is configured to output the first group data and the delayed second group data together for a second period equal to the first period.

14. The semiconductor device of claim 1, wherein
the output driver includes a plurality of driver blocks connected in series between a first voltage and a second voltage, and
each driver block of the plurality of driver blocks includes a pull-up transistor and a pull-down transistor and is configured to receive the first group data or the second group data at gates of the pull-up transistor and the pull-down transistor.

15. The semiconductor device of claim 14, wherein
a number of the plurality of driver blocks corresponding to a highermost bit of the first group data is greater than a number of the plurality of driver blocks corresponding to a lowermost bit of the first group data, and
a number of the plurality of driver blocks corresponding to a highermost bit of the second group data is greater than a number of the plurality of driver blocks corresponding to a lowermost bit of the second group data.

16. A memory system comprising:
a memory device including a transmitter configured to
  receive a plurality of bit data from a memory cell array and divide the plurality of bit data into first group data and second group data based on the memory cell array and duo-binary PAM-4, the plurality of bit data being divided into 2-bit units,
  delay the second group data for one unit interval (UI), and
  output the first group data and the delayed second group data together as a data input and output signal; and
a memory including a receiver configured to
  obtain current UI output data by decoding the data input and output signal for one unit interval (UI),
  obtain current UI PAM-4 (4-level pulse amplitude modulation) data by subtracting previous UI PAM-4 data from the current UI output data, and
  decode the current UI PAM-4 data into a non-return to zero (NRZ) signal.

17. The memory system of claim 16, wherein
the data input and output signal based on the duo-binary PAM-4 have a voltage level representing 7 symbols, and a maximum or highest transition voltage level is 3 levels.

18. The memory system of claim 16, wherein
the transmitter is configured to output the plurality of bit data from the memory cell array as the data input and output signal based on PAM-4,
the data input and output signal based on the PAM-4 have a voltage level representing 4 symbols, and
a maximum or highest transition voltage level is 3 levels.

19. The memory system of claim 16, wherein
each of the transmitter and the receiver are configured to operate using a plurality of clocks in which one period has four unit intervals.

20. A memory device comprising:
a memory cell array;
a serializer configured to convert i-bit parallel data of the memory cell array into j-bit serial data (i and j being positive numbers and i>j);
an encoder configured to output first bit data and second bit data of the j-bit serial data as first encoded data based on a first clock and to output third bit data and fourth bit data of the j-bit serial data as second encoded data based on a second clock having a phase difference of one unit interval from the first clock; and
an output driver including a first driver block configured to output the first encoded data for two unit intervals and a second driver block configured to output the second encoded data for the two unit intervals.

* * * * *

UNITED STATES PATENT AND TRADEMARK OFFICE
CERTIFICATE OF CORRECTION

| | | |
|---|---|---|
| PATENT NO. | : 12,401,553 B2 | Page 1 of 1 |
| APPLICATION NO. | : 18/360063 | |
| DATED | : August 26, 2025 | |
| INVENTOR(S) | : Junghoon Chun et al. | |

It is certified that error appears in the above-identified patent and that said Letters Patent is hereby corrected as shown below:

On the Title Page

Item [30], should read:
Foreign Application Priority Data
Oct. 7, 2022 (KR) ......................10-2022-0128762
Sept. 28, 2022 (KR) ......................10-2022-0123572

Signed and Sealed this
Eleventh Day of November, 2025

John A. Squires
*Director of the United States Patent and Trademark Office*